(12) United States Patent
Takamure et al.

(10) Patent No.: US 9,153,441 B2
(45) Date of Patent: *Oct. 6, 2015

(54) METHODS FOR FORMING DOPED SILICON OXIDE THIN FILMS

(71) Applicant: ASM International. N.V., Almere (NL)

(72) Inventors: Noboru Takamure, Tokyo (JP); Atsuki Fukazawa, Tokyo (JP); Hideaki Fukuda, Tokyo (JP); Antti Niskanen, Helsinki (FI); Suvi Haukka, Helsinki (FI); Ryu Nakano, Tokyo (JP); Kunitoshi Namba, Tokyo (JP)

(73) Assignee: ASM International, N.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/184,116

(22) Filed: Feb. 19, 2014

(65) Prior Publication Data
US 2015/0017794 A1    Jan. 15, 2015

Related U.S. Application Data

(63) Continuation of application No. 13/667,541, filed on Nov. 2, 2012, now Pat. No. 8,679,958.

(60) Provisional application No. 61/620,769, filed on Apr. 5, 2012, provisional application No. 61/556,033, filed on Nov. 4, 2011.

(51) Int. Cl.
| H01L 21/225 | (2006.01) |
| H01L 21/02 | (2006.01) |
| H01L 21/22 | (2006.01) |
| H01L 21/324 | (2006.01) |

(52) U.S. Cl.
CPC ........ H01L 21/2255 (2013.01); H01L 21/0228 (2013.01); H01L 21/02129 (2013.01); H01L 21/02164 (2013.01); H01L 21/02208 (2013.01); H01L 21/02219 (2013.01); H01L 21/02271 (2013.01); H01L 21/02274 (2013.01); H01L 21/2225 (2013.01); H01L 21/324 (2013.01)

(58) Field of Classification Search
CPC ................. H01L 21/2225; H01L 21/02271; H01L 21/02219; H01L 21/02129
USPC ......................................................... 438/558
See application file for complete search history.

(56) References Cited

U.S. PATENT DOCUMENTS

| 8,679,958 B2 * | 3/2014 | Takamure et al. ............ 438/513 |
| 2004/0137167 A1 | 7/2004 | Nguyen |
| 2004/0151845 A1 | 8/2004 | Nguyen et al. |
| 2009/0203197 A1 | 8/2009 | Hanawa et al. |
| 2012/0009802 A1 | 1/2012 | LaVoie et al. |
| 2012/0028454 A1 | 2/2012 | Swaminathan et al. |

* cited by examiner

*Primary Examiner* — Anthony Ho
(74) *Attorney, Agent, or Firm* — Knobbe, Martens, Olson & Bear LLP

(57) ABSTRACT

The present disclosure relates to the deposition of dopant films, such as doped silicon oxide films, by atomic layer deposition processes. In some embodiments, a substrate in a reaction space is contacted with pulses of a silicon precursor and a dopant precursor, such that the silicon precursor and dopant precursor adsorb on the substrate surface. Oxygen plasma is used to convert the adsorbed silicon precursor and dopant precursor to doped silicon oxide.

17 Claims, 32 Drawing Sheets

1  Si source supply : ~ 0.5s by FPS
2  Purge : ~ 1s
3  B or P source supply : ~ 0.5s by FPS
4  Purge : ~ 1s
5  RF step : ~1s by ~ 200W, ~ 300Pa
6  Purge : ~ 0.5s

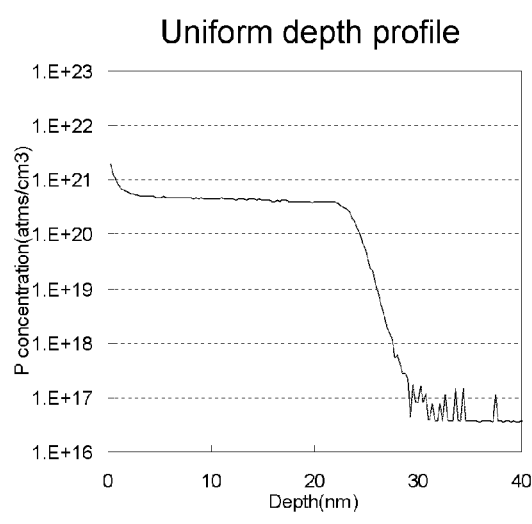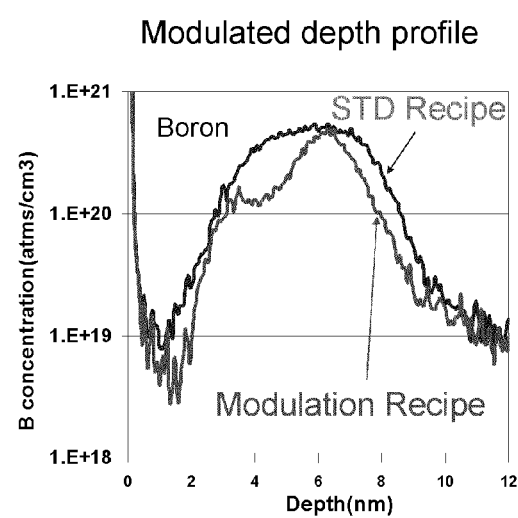
FIG. 19A  FIG. 19B
FIG. 19

FIG. 21A
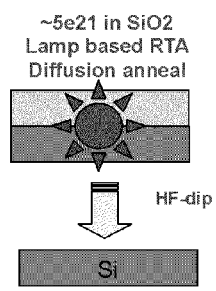
FIG. 21B
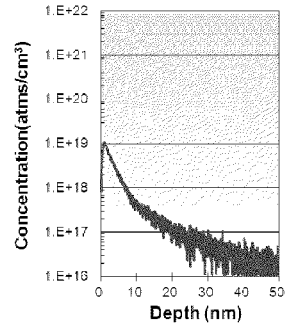
FIG. 21C
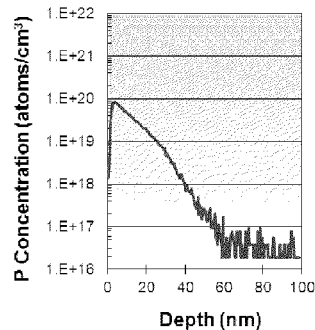
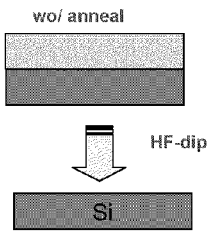
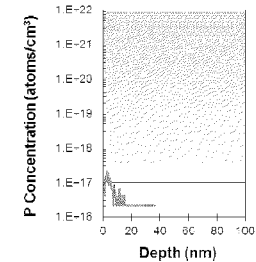
FIG. 21D
FIG. 21E
FIG. 21A – FIG. 21E

METHODS FOR FORMING DOPED SILICON OXIDE THIN FILMS

CROSS-REFERENCE TO RELATED APPLICATIONS

The present application is a continuation of U.S. application Ser. No. 13/667,541, filed Nov. 2, 2012, which claims priority to U.S. Provisional Application No. 61/556,033, filed Nov. 4, 2011, and U.S. Provisional Application No. 61/620,769, filed Apr. 5, 2012, the disclosures of which are incorporated herein by reference in their entirety.

BACKGROUND OF THE INVENTION

1. Field of the Invention

The present application relates generally to atomic layer deposition of dopant films, such as doped silicon oxide thin films.

2. Background

With the scale down of devices, deposition of dielectric films with good step coverage is desirable. Traditional ALD is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the additional gas phase reactants of the same pulse. A subsequent pulse of different reactants reacts with the previous termination to enable continued deposition. Thus each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

As described herein, Atomic Layer Deposition (ALD) processes can be used to deposit doped silicon oxide, such as BSG and PSG. ALD provides good step coverage on three-dimensional structures.

SUMMARY

Dopant thin films can be deposited by atomic layer deposition processes utilizing a dopant precursor and a reactive species. In some embodiments the dopant thin film may serve as a solid state diffusion (SSD) layer over a semiconductor substrate, such as in the formation of a finFet structure.

In accordance with one aspect, methods for forming doped silicon oxide thin films on a substrate in a reaction chamber by atomic layer deposition (ALD) are provided. In some embodiments the ALD process is a plasma enhanced ALD process (PEALD). In some embodiments the ALD process comprises providing a pulse of a silicon precursor into a reaction space comprising a substrate, providing a pulse of a dopant precursor into the reaction space, removing excess silicon and dopant precursors and contacting the substrate with a reactive species. In some embodiments the reactive species comprises oxygen and may be, for example, oxygen plasma. In some embodiments oxygen gas flows to the reaction chamber continuously throughout the process. In some embodiments the reactive species comprises excited species of nitrogen. The reactants can be provided in any order and in some embodiments the pulse of the dopant precursor and the pulse of the silicon precursor at least partially overlap.

In some embodiments, the methods include a doped silicon oxide deposition cycle comprising: providing a vapor phase first precursor pulse comprising a silicon precursor into the reaction chamber to form no more than about a single molecular layer of the silicon precursor on the substrate, providing a vapor phase second precursor pulse comprising a dopant precursor to the reaction chamber such that the dopant precursor adsorbs in a self-limiting manner on the substrate surface at the available binding sites, removing excess reactant and any reaction byproducts from the reaction chamber, providing a vapor phase third reactant pulse comprising oxygen plasma, such that the oxygen plasma converts the adsorbed silicon and dopant to a doped silicon oxide film. In some embodiments, oxygen flows continuously to the reaction chamber during the deposition process. Providing the vapor phase third reactant pulse comprises generating a plasma in the flowing oxygen. The oxygen plasma may be generated remotely or in the reaction chamber itself. In some embodiments the silicon precursor and the dopant precursor are provided simultaneously. In some embodiments the silicon precursor and dopant precursor are provided in pulses that at least partially overlap. In some embodiments the silicon precursor and the dopant precursor are provided alternately and sequentially. The deposition cycle is repeated until a thin film of a desired thickness and composition is obtained. In some embodiments, the dopant is selected from boron and phosphorus. The silicon precursor may be, for example, BDEAS (bis(diethylamino)silane (($C_2H_5$)$_2$N)$_2$SiH$_2$).

In some embodiments, a doped silicon oxide film is deposited by a PEALD process in which doped silicon oxide and undoped silicon oxide deposition cycles are provided at a ratio selected to achieve the desired dopant concentration in the doped silicon oxide film.

In some embodiments, a doped silicon oxide film is deposited by a PEALD process in which dopant oxide and undoped silicon oxide deposition cycles are provided at a ratio selected to achieve the desired dopant concentration in the doped silicon oxide film.

In accordance with another aspect of the present invention, methods for forming a FinFET structure are provided in which a doped silicon oxide film or other dopant film is deposited over the Fin by ALD.

In accordance with another aspect, methods of doping a silicon substrate are provided. The methods may comprise depositing a solid state diffusion (SSD) layer comprising a dopant over the surface of the silicon substrate by atomic layer deposition, depositing a cap layer over the SSD layer, and annealing the substrate to drive dopant from the SSD layer into the underlying silicon substrate. In some embodiments the substrate is treated with a plasma prior to depositing the SSD layer. In some embodiments the SSD layer is deposited by a plasma enhanced ALD process, in which the substrate is alternately and sequentially contacted with a dopant precursor and a plasma, such as an oxygen, nitrogen, argon, helium, hydrogen or fluorine plasma. The dopant may be, for example, phosphorus, arsenic, antimony, boron, gallium or indium. In some embodiments two or more of the plasma treatment, the deposition of the SSD layer and deposition of the cap layer are carried out in situ.

In accordance with another aspect, methods for depositing dopant compound films on a substrate in a reaction chamber are provided. The ALD process comprise at least one dopant precursor cycle, wherein a pulse of a dopant precursor is provided to the reaction chamber, excess dopant precursor is removed from the reaction chamber and the substrate is contacted with a reactive species such that a dopant compound film is formed. The dopant compound film may comprise a dopant selected from group 13, 14 or 15 elements. In some embodiments the dopant compound film may comprise PN, PC or BC.

For purposes of summarizing embodiments of the invention and some of the advantages achieved over the prior art, certain objects and advantages have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIGS. 19A and B illustrate a uniform depth profile for P (left) and a modulated depth profile for B in a modulated recipe compared to a standard recipe.

FIG. 21A-F illustrate dopant drive in for B and P following lamp based RTA anneal and drive in without anneal.

DETAILED DESCRIPTION

Figure 1:
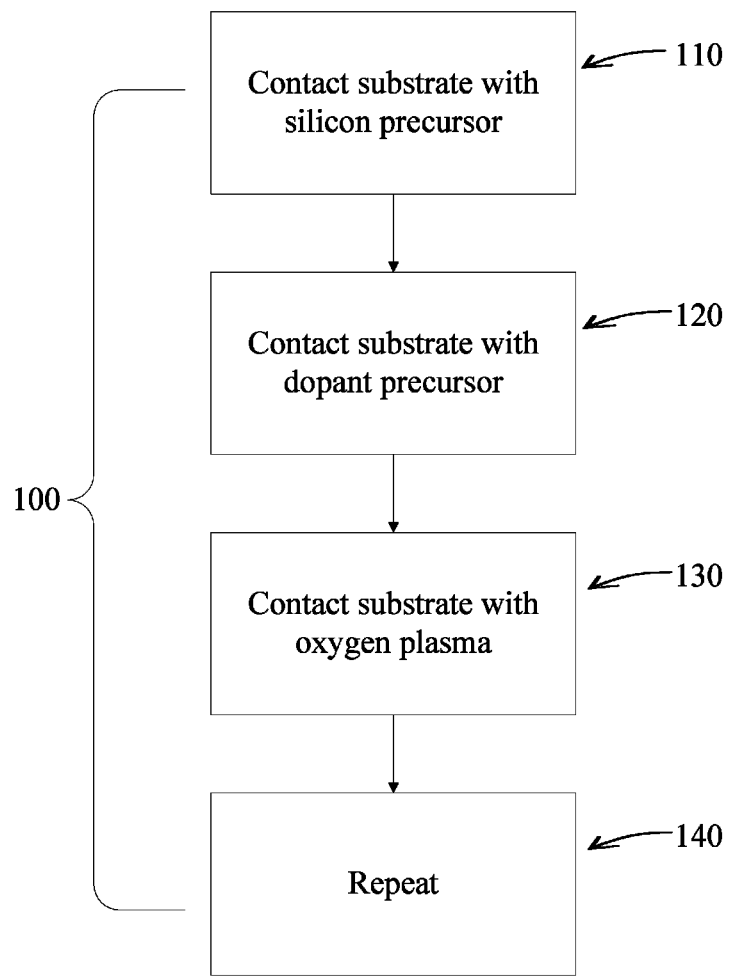
FIG. 1 is a flow chart generally illustrating a method for forming a doped silicon oxide thin film in accordance with one embodiment.

Thin film layers comprising a dopant, such as solid state doping (SSD) layers can be deposited by plasma-enhanced atomic layer deposition (PEALD) type processes. Doped silicon oxide, for example, has a wide variety of applications, as will be apparent to the skilled artisan. In some embodiments doped silicon oxide thin films, such as borosilicate glass (BSG) and phosphosilicate glass (PSG) can be deposited on a substrate by PEALD type processes. In some embodiments dopant thin films such as PN, BN, PC or BC films can be deposited on a substrate by PEALD. ALD can provide good step coverage, as well as precise control of the dopant content. Thus, in some embodiments a dopant thin film is deposited over a three dimensional structure, such as a fin in the formation of a finFET device. The thickness and composition of the layers can be controlled to produce a doped silicon oxide film or other dopant film with the desired characteristics. In some embodiments, a doped silicon oxide film or other dopant layer, such as an SSD layer, can be used as a dopant source for doping a semiconductor. For example, a doped silicon oxide or other dopant layer can be used as a dopant source to drive dopant into an underlying semiconductor layer, such as a silicon layer. The semiconductor layer to be doped may be, for example, a fin of a finFET device. In some embodiments, the doped silicon oxide layer is encapsulated with an undoped silicon oxide layer.

The formula of the silicon oxide is generally referred to herein as $SiO_2$ for convenience and simplicity. However, the skilled artisan will understand that the actual formula of the silicon oxide can be $SiO_x$, where x varies around 2, as long as some Si—O bonds are formed. Generally silicon oxide where Si has an oxidation state of +IV is formed and the amount of oxygen in the material might vary, for example, depending on the dopant content.

ALD type processes are based on controlled, self-limiting surface reactions. Gas phase reactions are avoided by contacting the substrate alternately and sequentially with reactants. Vapor phase reactants are separated from each other in the reaction chamber, for example, by removing excess reactants and/or reactant byproducts from the reaction chamber between reactant pulses.

The methods presented herein allow deposition of doped silicon oxide films and other dopant films on substrate surfaces. Geometrically challenging applications are also possible due to the nature of the ALD-type processes. According to some embodiments, atomic layer deposition (ALD) type processes are used to form doped silicon oxide films or other dopant films on substrates such as integrated circuit workpieces.

A substrate or workpiece is placed in a reaction chamber and subjected to alternately repeated surface reactions. In particular, thin films are formed by repetition of a self-limiting ALD cycle. Preferably, for forming doped silicon oxide films each ALD cycle comprises at least three distinct phases. The provision and removal of a reactant from the reaction space may be considered a phase. In a first phase, a first reactant comprising silicon is provided and forms no more than about one monolayer on the substrate surface. This reactant is also referred to herein as "the silicon precursor" or "silicon reactant" and may be, for example, BDEAS. In a second phase, a second reactant comprising a dopant is provided and adsorbs to available binding sites. This second reactant may also be referred to as a "dopant precursor." The second reactant may comprise an element from group 13 (IUPAC new numbering, IIIB according to old IUPAC numbering and IIIA according to CAS American numbering), such as boron, an element from group 14 (IUPAC new numbering, IVB according to old IUPAC numbering and IVA according to CAS American numbering), such as carbon and/or an element from group 15 (IUPAC new numbering, VB according to old IUPAC European numbering and VA according to CAS American numbering), such as phosphorus or arsenic. In some embodiments the second reactant may be, for example, a boron, phosphorous, carbon or arsenic precursor. In a third phase, a third reactant comprising a reactive species is provided and may convert adsorbed silicon and dopant precursors to the doped silicon oxide. In some embodiments the reactive species comprises an excited species. In some embodiments the reactive species comprises oxygen plasma, oxygen atoms and/or oxygen radicals. In some embodiments the reactive species comprises a species of oxygen that is not excited, such as ozone, and is used, for example, in a thermal ALD process. In some embodiments the reactive species comprises ozone. In some embodiments the silicon reactant and/or the dopant reactant comprises oxygen and the reactive species does not. In some embodiments the reactive species comprises excited species made by plasma discharge. In some embodiments the reactive species comprises nitrogen radicals, nitrogen atoms and/or nitrogen plasma. In some embodiments a reactive species may comprise a He or Ar plasma. In some embodiments a gas that is used to form a plasma may flow constantly throughout the process but only be activated intermittently. Additional phases may be added and phases may be removed as desired to adjust the composition of the final film.

One or more of the reactants may be provided with the aid of a carrier gas, such as Ar or He. In some embodiments the silicon precursor and the dopant precursor are provided with the aid of a carrier gas. In some embodiments, two of the phases may overlap, or be combined. For example, the silicon precursor and the dopant precursor may be provided simultaneously in pulses that partially or completely overlap. In addition, although referred to as the first, second and third phases, and the first second and third reactants, the order of the phases may be varied, and an ALD cycle may begin with any one of the phases. That is, unless specified otherwise, the reactants can be provided in any order and the process may begin with any of the reactants.

As discussed in more detail below, in some embodiments for depositing doped silicon oxide, one or more deposition cycles begin with provision of the silicon precursor, followed by the dopant precursor and a reactive oxygen species. In other embodiments, one or more deposition cycles begin with provision of the dopant precursor, followed by the silicon precursor and the reactive oxygen species. In other embodiments deposition may begin with provision of the reactive oxygen species, followed by either the silicon precursor or the dopant precursor.

In some embodiments for forming other types of dopant films each ALD cycle comprises at least two distinct phases. In a first phase, a first reactant comprising a dopant will form no more than about one monolayer on the substrate surface. This reactant may also be referred to as a dopant precursor. The dopant precursor may comprise, for example, an element from the group 13 (IUPAC new numbering, IIIB according to old IUPAC numbering and IIIA according to CAS American numbering), such as boron, an element from the group 14 (IUPAC new numbering, IVB according to old IUPAC numbering and IVA according to CAS American numbering), such as carbon and/or an element from the group 15 (IUPAC new numbering, VB according to old IUPAC European numbering and VA according to CAS American numbering), such as phosphorus or arsenic. In some embodiments the second reactant may be, for example, a boron, phosphorous, carbon and/or arsenic precursor. In some embodiments the dopant precursor comprises carbon as well as another dopant, such as an element from group 13 or group 15. For example, the dopant precursor may comprise boron and carbon or phosphorus and carbon. In a second phase a second reactant comprising a reactive species is provided and converts the adsorbed dopant precursor compound to the dopant film. In some embodiments the reactive species comprises oxygen plasma, oxygen atoms and/or oxygen radicals. In some embodiments the reactive species comprises ozone. In some embodiments the reactive species comprises excited species made by plasma discharge. In some embodiments the reactive species comprises nitrogen radicals, nitrogen atoms and/or nitrogen plasma. In some embodiments the reactive species comprises He or Ar plasma. In some embodiments the reactive species is formed by forming a plasma intermittently in a gas that is flowing constantly throughout the process, such as by forming N plasma intermittently from flowing N. Additional phases may be added as desired to adjust the composition of the film.

Again, one or more of the reactants may be provided with the aid of a carrier gas, such as Ar or He. In some embodiments the dopant precursor is provided with the aid of a carrier gas. In some embodiments, Although referred to as a first phase and a second phase and a first and second reactant, the order of the phases and thus the order of provision of the reactants may be varied, and an ALD cycle may begin with any one of the phases.

In some embodiments, one or more deposition cycles begin with provision of the dopant precursor followed by a reactive species. In other embodiments, one or more deposition cycles begin with provision of the reactive species followed by the dopant precursor. The reactive species is then provided again in the next cycle.

In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP and XP8. Exemplary batch ALD reactors, designed specifically to enhance ALD processes, are commercially available from and ASM Europe B.V (Almere, Netherlands) under the tradenames A4ALD™ and A412™.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

The reaction chamber is typically purged between reactant pulses. The flow rate and time of each reactant, is tunable, as is the purge step, allowing for control of the dopant concentration and depth profile in the film.

As mentioned above, in some embodiments, a gas is provided to the reaction chamber continuously during each deposition cycle, or during the entire ALD process, and reactive species are provided by generating a plasma in the gas, either in the reaction chamber or upstream of the reaction chamber. In some embodiments the gas is oxygen. In other embodiments the gas may be nitrogen, helium or argon. The flowing gas may also serve as a purge gas for the first and/or second precursor, as well as for the reactive species. For example, flowing oxygen may serve as a purge gas for a first silicon precursor and a second dopant precursor, as well as for reactive oxygen species. In some embodiments nitrogen, argon or helium may serve as a purge gas for a dopant precursor and a source of excited species for converting the dopant precursor to the dopant film.

The cycle is repeated until a film of the desired thickness and composition is obtained. In some embodiments the deposition parameters, such as the flow rate, flow time, purge time, and/or precursors themselves, may be varied in one or more deposition cycles during the ALD process in order to obtain a film with the desired characteristics. In some embodiments, hydrogen and/or hydrogen plasma are not provided in a deposition cycle, or in the deposition process.

The term "pulse" may be understood to comprise feeding reactant into the reaction chamber for a predetermined amount of time. The term "pulse" does not restrict the length or duration of the pulse and a pulse can be any length of time.

In some embodiments, the silicon precursor is provided first. After an initial surface termination, if necessary or desired, a first silicon precursor pulse is supplied to the workpiece. In accordance with some embodiments, the first precursor pulse comprises a carrier gas flow and a volatile silicon species, such as BDEAS, that is reactive with the workpiece surfaces of interest. Accordingly, the silicon precursor adsorbs upon the workpiece surfaces. The first precursor pulse self-saturates the workpiece surfaces such that any excess constituents of the first precursor pulse do not further react with the molecular layer formed by this process.

The first silicon precursor pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon precursor pulse is from about 0.05 to about 5.0 seconds, about 0.1 to about 3 s or about 0.2 to about 1.0 s.

After sufficient time for a molecular layer to adsorb on the substrate surface, excess first precursor is then removed from the reaction space. In some embodiments the excess first precursor is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of oxygen gas that is flowing throughout the ALD cycle.

In some embodiments, the first precursor is purged for about 0.1 to about 10 s, about 0.3 to about 5 s or about 0.3 to about 1 s. Provision and removal of the silicon precursor can be considered the first or silicon phase of the ALD cycle.

A second, dopant precursor is pulsed into the reaction space to contact the substrate surface. The dopant precursor may be provided with the aid of a carrier gas. The dopant precursor may be, for example, a boron precursor, such as triethyl boron (TEB) or trimethyl boron (TMB), or a phosphorous precursor, such as trimethylphosphite (TMPI). The precursor pulse is also preferably supplied in gaseous form. The dopant precursor is considered "volatile" for purposes of the present description if the species exhibits sufficient vapor pressure under the process conditions to transport the species to the workpiece in sufficient concentration to saturate exposed surfaces.

In some embodiments, the dopant precursor pulse is about 0.05 to about 5.0 s, 0.1 to about 3.0 s or 0.2 to about 1.0 s.

After sufficient time for a molecular layer to adsorb on the substrate surface at the available binding sites, the second dopant precursor is then removed from the reaction space. In some embodiments the flow of the second chemistry is stopped while continuing to flow a carrier gas for a sufficient time to diffuse or purge excess reactants and reactant by-products, if any, from the reaction space, preferably with greater than about two reaction chamber volumes of the purge gas, more preferably with greater than about three chamber volumes. In some embodiments the purge gas is an oxygen gas that is flowing continuously throughout the ALD process. Provision and removal of the dopant precursor can be considered the second or dopant phase of the ALD cycle.

In some embodiments, the dopant precursor is purged for about 0.1 to about 10.0 s, 0.3 to about 5.0 s or 0.3 to 1.0 s.

The flow rate and time of the dopant precursor pulse, as well as the purge step of the dopant phase, are tunable to achieve a desired dopant concentration and depth profile in the doped silicon oxide film. Although the adsorption of the dopant precursor on the substrate surface is self-limiting, due to the limited number of binding sites, pulsing parameters can be adjusted such that less than a monolayer of dopant is adsorbed in one or more cycles.

In the third phase, reactive species, such as oxygen plasma is provided to the workpiece. Oxygen, $O_2$, is flowed continuously to the reaction chamber during each ALD cycle in some embodiments. Oxygen plasma may be formed by generating a plasma in oxygen in the reaction chamber or upstream of the reaction chamber, for example by flowing the oxygen through a remote plasma generator.

Typically, the oxygen plasma is provided for about 0.1 to about 10 seconds. In some embodiments oxygen plasma is provided for about 0.1 to about 10 s, 0.5 to about 5 s or 0.5 to about 2.0 s. However, depending on the reactor type, substrate type and its surface area, the oxygen plasma pulsing time may be even higher than 10 seconds. In some embodiments, pulsing times can be on the order of minutes. The optimum pulsing time can be readily determined by the skilled artisan based on the particular circumstances.

Oxygen plasma may be generated by applying RF power of from about 10 to about 1000 W, preferably from about 30 to about 500 W, more preferably from about 50 to about 300 W in some embodiments. The RF power may be applied to oxygen that flows during the oxygen plasma pulse time, that flows continuously through the reaction chamber, and/or that flows through a remote plasma generator. Thus in some embodiments the plasma is generated in situ, while in other embodiments the plasma is generated remotely.

After a time period sufficient to completely saturate and react the previously adsorbed molecular layer with the oxygen plasma pulse, any excess reactant and reaction byproducts are removed from the reaction space. As with the removal of the first two reactants, this step may comprise stopping the generation of reactive species and continuing to flow the oxygen for a time period sufficient for excess reactive species and volatile reaction by-products to diffuse out of and be purged from the reaction space. In other embodiments a separate purge gas may be used. The purge may, in some embodiments, be from about 0.1 to about 10 s, about 0.1 to about 4 s or about 0.1 to about 0.5 s. Together, the oxygen plasma provision and removal represent a third phase in a doped silicon oxide atomic layer deposition cycle, and can also be considered the oxidation phase.

The three phases together represent one ALD cycle, which is repeated to form doped silicon oxide thin films of the desired thickness. While the ALD cycle is generally referred to herein as beginning with the silicon phase, it is contemplated that in other embodiments the cycle may begin with the dopant phase or with the oxidation phase. One of skill in the art will recognize that the first precursor phase generally reacts with the termination left by the last phase in the previous cycle. Thus, while no reactant may be previously adsorbed on the substrate surface or present in the reaction space if the oxidation phase is the first phase in the first ALD cycle, in subsequent cycles the oxidation phase will effectively follow the silicon phase. In some embodiments one or more different ALD cycles are provided in the deposition process.

In some embodiments, a doped silicon oxide ALD cycle comprises a silicon phase, a dopant phase and an oxidation phase. The silicon phase comprises providing a pulse of BDEAS to a reaction chamber comprising a substrate. Excess BDEAS is removed and the substrate is contacted with a pulse of a dopant precursor in the dopant phase. The dopant precursor may be, for example, a pulse of a boron dopant precursor, for example triethyl boron (TEB) or a pulse of a phosphorus dopant precursor, such as trimethylphosphite (TMPI). Excess dopant precursor and reaction by-products, if any, are removed. The substrate is then contacted with oxygen plasma to form a boron or phosphorous-doped silicon oxide. The oxygen plasma may be generated in situ, for example in an oxygen gas that flows continuously throughout the ALD cycle. In other embodiments the oxygen plasma may be generated remotely and provided to the reaction chamber.

As mentioned above, each pulse or phase of each ALD cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface. However, in some embodiments the dopant precursor step is not self-limiting, for example, due to decomposition or gas phase reactions.

As discussed above, in some embodiments, an ALD process begins with the silicon phase, followed by the dopant phase and, in turn, the oxidation phase. However, in other embodiments the dopant phase is first, followed by the silicon phase and the oxidation phase. For example, the substrate may first be contacted with a pulse of a boron dopant precursor, for example triethyl boron (TEB) or a pulse of a phosphorus dopant precursor, such as trimethylphosphite (TMPI). Excess dopant precursor is removed. The substrate is then contacted with a silicon precursor, such as BDEAS. Excess silicon precursor and reaction by-products, if any, are removed. The substrate is then contacted with an oxygen plasma to form a boron or phosphorous-doped silicon oxide. The oxygen plasma may be generated in situ, for example in an oxygen gas that flows continuously throughout the ALD cycle, or remotely.

In some embodiments, the silicon precursor and the dopant precursor are both provided prior to any purge step. Thus, in some embodiments a pulse of silicon precursor is provided, a pulse of dopant precursor is provided, and any unreacted silicon and dopant precursor is purged from the reaction space. The silicon precursor and the dopant precursor may be provided sequentially, beginning with either the silicon precursor or the dopant precursor, or together. In some embodiments, the silicon precursor and dopant precursor are provided simultaneously. The ratio of the dopant precursor to the silicon precursor may be selected to obtain a desired concentration of dopant in the deposited thin film.

After removal of unreacted silicon and dopant precursor, reactive species or excited species, such as ozone or oxygen radicals, oxygen atoms or oxygen plasma may be generated, such as in flowing oxygen gas, and are contacted with the substrate. Again, in some embodiments oxygen gas may be flowing continuously to the reaction space during the ALD cycle. In other embodiments the excited species, such as oxygen radicals may be generated remotely. The reactive species or excited species react with adsorbed silicon and dopant precursor, forming a layer of doped silicon oxide.

FIG. 1 is a flow chart generally illustrating a doped silicon oxide ALD deposition cycle that can be used to deposit a doped silicon oxide thin film in accordance with some embodiments. According to one embodiment, a doped silicon oxide thin film is formed on a substrate by an ALD type process comprising multiple doped silicon oxide deposition cycles, each doped silicon oxide deposition cycle 100 comprising:

contacting a substrate with a vaporized silicon compound 110 such that the silicon compound adsorbs on the substrate surface;

contacting the substrate with a vaporized dopant precursor compound 120; and contacting the substrate with oxygen plasma 130, thereby converting the adsorbed silicon compound and dopant precursor compound into doped silicon oxide. Oxygen may flow continuously throughout the cycle, with oxygen plasma formed at the appropriate times to convert adsorbed silicon compound and dopant precursor into doped silicon oxide.

As mentioned above, in some embodiments the substrate may be contacted simultaneously with the silicon compound and the dopant precursor compound, while in other embodiments these reactants are provided separately.

The contacting steps are repeated 140 until a thin film of a desired thickness and composition is obtained. Excess reactants may be purged from the reaction space after each contacting step.

Figure 2:
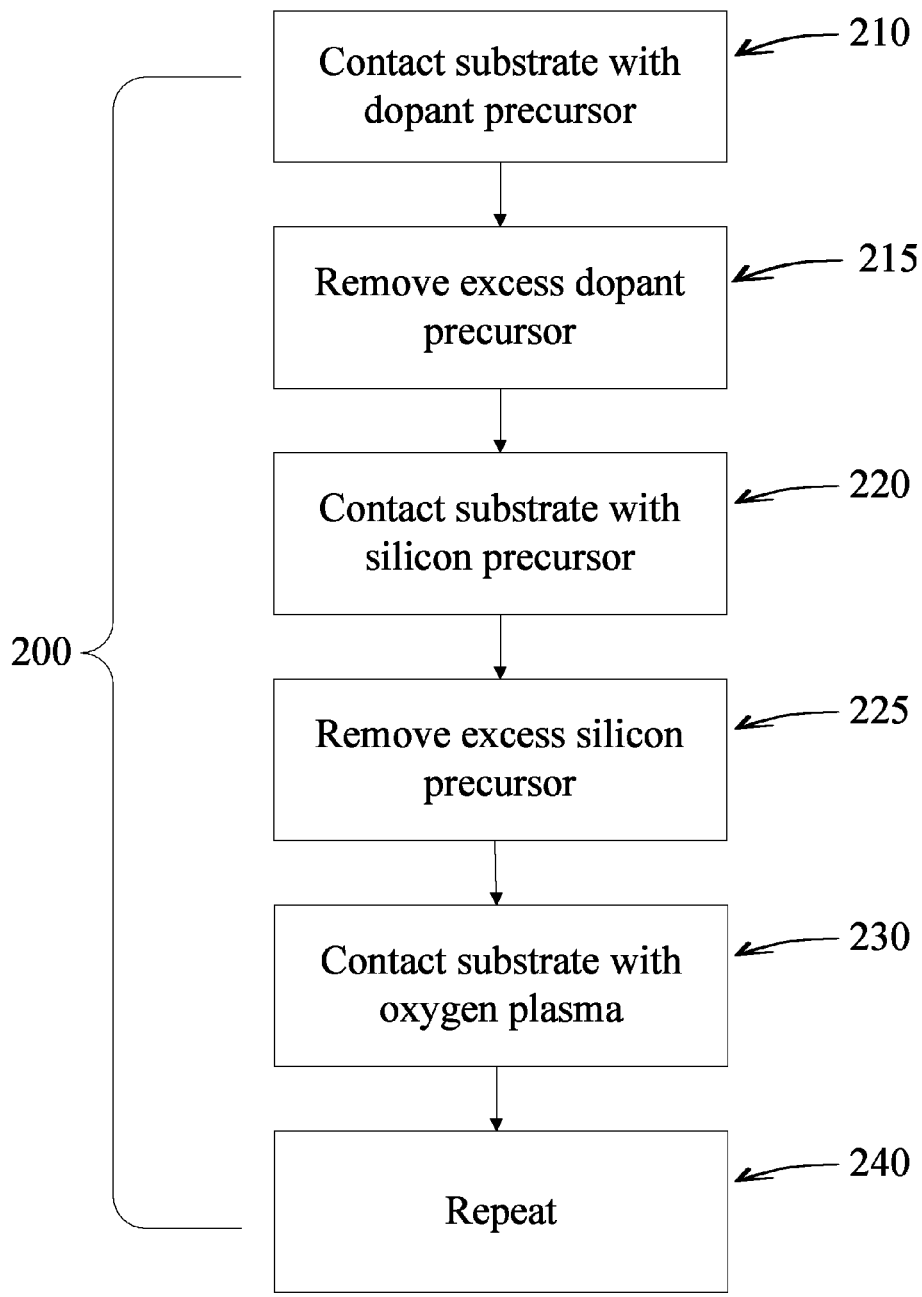
FIG. 2 is a flow chart generally illustrating the pulsing sequence for a method of forming a doped silicon oxide thin film.

FIG. 2 is a flow chart generally illustrating another doped silicon oxide ALD cycle for forming a doped silicon oxide thin film in accordance with some embodiments. According to such embodiments, a doped silicon oxide thin film is formed on a substrate by an ALD type process comprising multiple doped silicon oxide deposition cycles, each doped silicon oxide deposition cycle 200 comprising:

contacting the substrate with a vaporized dopant precursor compound 210;

removing excess dopant precursor 215;

contacting the substrate with a vaporized silicon compound 220 such that the silicon compound adsorbs to the substrate;

removing excess silicon compound 225; and contacting the substrate with oxygen plasma 230, thereby converting the adsorbed silicon compound and dopant precursor compound into doped silicon oxide. In some embodiments oxygen may flow continuously throughout the cycle, with oxygen plasma formed at the appropriate times to convert adsorbed silicon compound and dopant precursor into doped silicon oxide. In some embodiments, oxygen plasma may be generated remotely.

The contacting steps are repeated 240 until a thin film of a desired thickness and composition is obtained.

Figure 3:
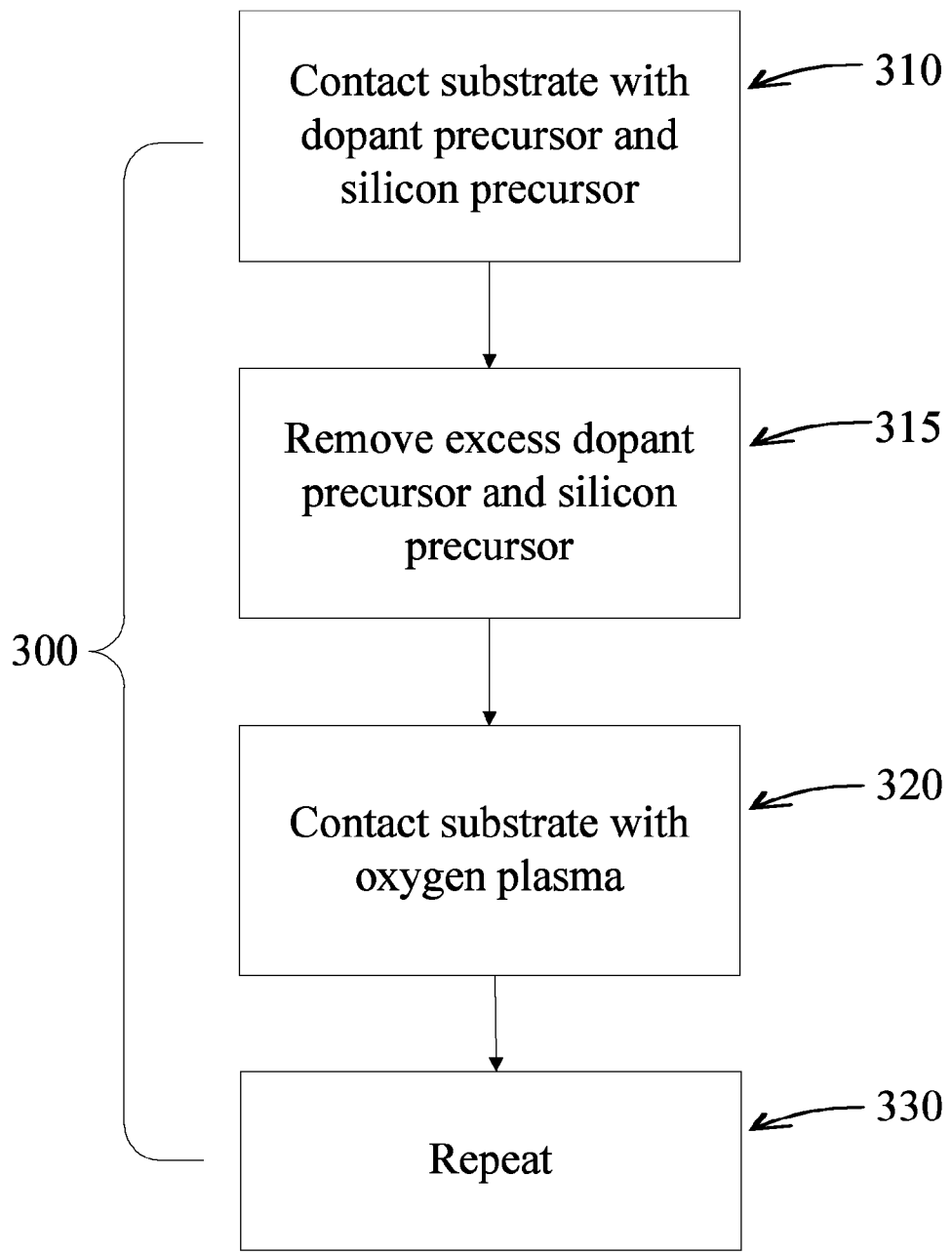
FIG. 3 is a flow chart generally illustrating the pulsing sequence for a method of forming a doped silicon oxide thin film.

As mentioned above, in some embodiments, the silicon precursor and dopant precursor may be provided either sequentially or simultaneously, without an intervening purge step. Such an embodiment is illustrated in FIG. 3, in which a doped silicon oxide thin film is formed on a substrate by an ALD type process comprising multiple doped silicon oxide deposition cycles 300 comprising:

contacting the substrate with a vaporized dopant precursor compound and a vaporized silicon compound 310 such that the dopant compound and silicon compound adsorb to the substrate;

removing excess dopant precursor and silicon compound 315; and contacting the substrate with oxygen plasma 320, thereby converting the adsorbed silicon compound and dopant precursor compound into doped silicon oxide. The cycle may be repeated 330 one or more times. In some embodiments the oxygen may flow continuously throughout the cycle, with oxygen plasma formed intermittently to convert the adsorbed silicon compound and dopant precursor into the doped silicon oxide. In some embodiments oxygen plasma is generated remotely and provided to the reaction space.

As discussed above, the deposition process typically comprises multiple ALD deposition cycles. In some embodiments, the dopant precursor is provided in every deposition cycle. In other embodiments, however, the dopant precursor may be provided in only a portion of the deposition cycles. Cycles in which dopant precursor is provided may be called dopant precursor cycles, while cycles in which dopant is not provided may be called silicon precursor cycles. In some embodiments a silicon precursor is also provided in the dopant precursor cycles, as described above. An exemplary silicon precursor cycle may comprise, for example, alternately and sequentially contacting the substrate with a silicon precursor and an oxygen reactant. In some embodiments the silicon precursor is the same reactant that is used in a dopant precursor cycle, while in some embodiments the silicon precursor may be different. In some embodiments the oxygen reactive species is the same as that used in the dopant precursor cycle, while in other embodiments a different oxygen reactive species may be used.

The ratio of silicon precursor cycles to dopant precursor cycles may be selected to control the dopant concentration in the ultimate film deposited by the PEALD process. For example, for a low dopant density, the ratio of dopant precursor cycles to silicon precursor cycles may be on the order of 1:10. For a higher concentration of dopant, the ratio may range up to about 1:1 or higher such as 1.5:1, 2:1, 2.5:1, 3:1, 4:1 etc. . . . . In some embodiments all of the deposition cycles in an ALD process may be dopant precursor cycles. The ratio of deposition cycles comprising dopant to deposition cycles that do not include dopant (such as the ratio of dopant precursor cycles to silicon precursor cycles, or the ratio of dopant oxide cycles to silicon precursor cycles) may be referred to as the control knob. For example, if one dopant precursor cycle is provided for every four silicon precursor cycles, the control knob is 0.25. If no undoped oxide cycles are used, the control knob may be considered to be infinite.

By controlling the ratio of dopant precursor cycle to silicon precursor cycle, the dopant concentration can be controlled from a density range of about 0 atoms of dopant to about $5E22/cm^3$ atoms of dopant. Density may be measured, for example, by SIMS (secondary-ion-probe mass spectrometry). For B and P doped films, this upper range is close to $B_2O_3$ or $P_2O_5$.

In addition, the dopant density can be varied across the thickness of the film by changing the ratio of dopant precursor cycles to silicon precursor cycles during the deposition process. For example, a high density of dopant may be provided near the substrate surface (lower ratio of silicon precursor cycles to dopant precursor cycle), such as near a Si surface (corresponding to the bottom of the doped silicon oxide surface, such as a BSG or PSG surface) and the density of dopant at the top surface away from the substrate may be low (higher ratio of silicon precursor cycles to dopant precursor cycles). In other embodiments a high density of dopant may be provided at the top surface with a lower density near the substrate surface.

In some embodiments, a doped silicon oxide layer is formed by providing a dopant precursor cycle at certain intervals in a silicon oxide deposition process. The interval may be based, for example, on cycle number or thickness. For example, one or more dopant precursor deposition cycles may be provided after each set of a predetermined number of silicon precursor deposition cycles, such as after every 10, 20, 50, 100, 200, 500 etc. . . . undoped silicon oxide deposition cycles. In some embodiments undoped silicon oxide deposition cycles may be repeated until a silicon oxide layer of a predetermined thickness is reached, at which point one or more dopant precursor cycles are then carried out. This process is repeated such that dopant is incorporated in the film at specific thickness intervals. For example, one or more dopant precursor cycles may be provided after each 5 nm of undoped $SiO_2$ that is deposited. The process is then repeated until a doped silicon oxide thin film of a desired thickness and composition has been deposited.

In some embodiments in an ALD process for producing doped silicon oxide films, one or more "dopant oxide" deposition cycles are provided along with undoped silicon oxide deposition cycles. The process may also include one or more doped silicon oxide deposition cycles.

In the "dopant oxide" deposition cycles, the silicon precursor is omitted from the doped silicon oxide deposition cycles described above. Thus, the substrate is exposed to alternating and sequential pulses of dopant precursor and an oxidant, such as oxygen plasma. Other reactive oxygen sources may be used in some embodiments. In some embodiments, a doped silicon oxide film is provided by conducting multiple dopant oxide deposition cycles and multiple silicon oxide deposition cycles. The ratio of dopant oxide cycles to silicon precursor cycle may be selected to control the dopant concentration in the ultimate doped silicon oxide film. For example, for a low dopant density, the ratio of dopant oxide cycles to silicon precursor cycle may be on the order of 1:10. In other embodiments a high dopant density is achieved by increasing the ratio of dopant oxide cycles to silicon precursor cycle to 1:1 or even higher, such as 1.5:1, 2:1, 2.5:1, 3:1, 4:1 etc. . . . . For example, for a high dopant density, such as a high B density, the ratio of dopant oxide cycles to silicon precursor cycle may be on the order of 6:1, or even 10:1.

Here too, the density can be varied across the thickness of the film by changing the ratio of dopant oxide cycles to silicon oxide cycles during the deposition process. For example, a high density of dopant may be provided near the substrate surface by using a lower ratio of silicon oxide cycles to dopant oxide cycles and the density of dopant at the top surface may be lower by providing a higher ratio of silicon oxide cycles to dopant oxide cycles.

As discussed above, in other embodiments, a dopant film that is not a doped silicon oxide is deposited by an ALD process. For example, the film may be a PN film, a BN film, a BC film or a PC film. According to some embodiments, a dopant thin film is formed on a substrate by an ALD type process, such as a PEALD process, comprising multiple deposition cycles, each deposition cycle comprising:

contacting the substrate with a vaporized dopant precursor; removing excess dopant precursor; and
contacting the substrate with a reactive species, thereby converting the adsorbed dopant precursor into the dopant film.

The dopant precursor may be provided with the aid of a carrier gas. The dopant precursor may be, for example, a boron precursor, such as triethyl boron (TEB), or a phosphorous precursor, such as trimethylphosphite (TMPI). The dopant precursor pulse is also preferably supplied in gaseous form. The dopant precursor is considered "volatile" for purposes of the present description if the species exhibits sufficient vapor pressure under the process conditions to transport the species to the workpiece in sufficient concentration to saturate exposed surfaces.

In some embodiments, the dopant precursor pulse is about 0.05 to about 5.0 s, 0.1 to about 3.0 s or 0.2 to about 1.0 s.

After sufficient time for a molecular layer to adsorb on the substrate surface at the available binding sites, the excess dopant precursor is then removed from the reaction space. In some embodiments the flow of the dopant precursor is stopped while continuing to flow a carrier gas for a sufficient time to diffuse or purge excess reactants and reactant by-products, if any, from the reaction space. In some embodiments the purge gas is flowing continuously throughout the ALD process. Provision and removal of the dopant precursor can be considered the dopant phase of the ALD cycle, as discussed above.

In some embodiments, the dopant precursor is purged for about 0.1 to about 10.0 s, 0.3 to about 5.0 s or 0.3 to 1.0 s.

The flow rate and time of the dopant precursor pulse, as well as the purge step of the dopant phase, are tunable to achieve a desired dopant concentration and depth profile in the dopant film. Although the adsorption of the dopant precursor on the substrate surface is self-limiting, due to the limited number of binding sites, pulsing parameters can be adjusted such that less than a monolayer of dopant is adsorbed in one or more cycles.

In the second phase, reactive species, such as plasma is provided to the workpiece. The plasma may be, for example, nitrogen, argon or helium plasma. Plasma may be generated as described elsewhere herein and may be generated remotely or in situ. In some embodiments, the reactive species may contribute one or more species to the dopant film. For example, nitrogen may be contributed by a reactive species comprising nitrogen.

Typically, the reactive species is provided for about 0.1 to about 10 seconds. However, depending on the reactor type, substrate type and its surface area, the pulsing time may be even higher than 10 seconds. In some embodiments, pulsing times can be on the order of minutes. The optimum pulsing time can be readily determined by the skilled artisan based on the particular circumstances.

After a time period sufficient to completely saturate and react the previously adsorbed molecular layer with the reactive species, any excess reactive species and reaction byproducts are removed from the reaction space. This step may comprise stopping the generation of reactive species and continuing to flow a gas from which the reactive species were generated or carrier gas for a time period sufficient for excess reactive species and volatile reaction by-products to diffuse out of and be purged from the reaction space. In other embodiments a separate purge gas may be used. The purge may, in some embodiments, be from about 0.1 to about 10 s, about 0.1 to about 4 s or about 0.1 to about 0.5 s. Together, the reactive species provision and removal represent a second phase in a dopant film atomic layer deposition cycle, and can also be considered the reactive species phase.

The two phases together represent one ALD cycle, which is repeated to form dopant thin films of the desired thickness. Additional reactants and/or additional phases may be added to achieve a desired composition. While the ALD cycle is generally referred to herein as beginning with the dopant phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the dopant phase. In some embodiments one or more different ALD cycles are provided in the deposition process.

Deposition temperatures are maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature is preferably at or below about 400° C. In some embodiments the deposition temperature is about 20 to about 400° C., about 50 to about 400° C. or about 100 to about 400° C.

The deposition processes can be carried out at a wide range of pressure conditions, but it is preferred to operate the process at reduced pressure. The pressure in the reaction chamber is typically from about 0.1 Pa to about 50000 Pa or more. However, in some cases the pressure will be higher or lower than this range, as can be readily determined by the skilled artisan. The pressure in a single wafer reactor is preferably maintained between about 50 Pa and 1000 Pa, preferably between about 100 and 600 Pa and more preferably between about 150 Pa and 500 Pa. In some embodiments, the pressure in a batch ALD reactor is preferably maintained between about 0.1 Pa and 70 Pa, more preferably between about 4 Pa and about 25 Pa.

The reactant source temperature, such as the silicon source temperature, is preferably set below the deposition or substrate temperature. This is based on the fact that if the partial pressure of the source chemical vapor exceeds the condensation limit at the substrate temperature, controlled layer-by-layer growth of the thin film is compromised.

In some embodiments, the silicon source temperature is from about 20 to about 150° C. In some embodiments the silicon source temperature is greater than about 60° C. during the deposition. For example, in some single wafer processes the silicon source may be between about room temperature and about 100° C. The dopant precursor source may be at about the same temperature. —In some embodiments, where greater doses are needed, for example in batch ALD, the silicon source temperature is from about 90° C. to about 200° C., preferably from about 130° C. to about 170° C.

In some embodiments the growth rate of the thin films, such as thin films comprising doped silicon oxide is preferably from about 0.8 to about 2.0 Å/cycle. In other embodiments the growth rate is about 1.0 to about 1.5 Å/cycle.

In some embodiments the deposited thin films comprising doped silicon oxide have a refractive index from about 1.6 to about 1.9 (as measured with a wavelength of 633 nm). In some embodiments the refractive index of BSG or PSG is about 1.48 as measured at 633 nm.

In some embodiments, the deposited thin films, such as the doped silicon oxide thin films, are deposited on a three dimensional structure and have step coverage of greater than about 80%, greater than about 90%, greater than about 95% or step coverage of about 100%.

In some embodiments the deposited films, such as the films comprising silicon oxide, have a step coverage of more than 80%, in other embodiments preferably more than 90% and in other embodiments preferably more than 95%.

In some embodiments the thin films, such as the doped silicon oxide films, are deposited to a thickness of 5 nm or less or 10 nm or less. However, in some situations dopant thin films, such as doped silicon oxide films, of greater thickness, such as 10 nm or more, 30 nm or more, 50 nm or more or even 100 nm or more may be deposited. The specific thickness can be selected by the skilled artisan based on the particular circumstances.

Source Materials

In general, the source materials, (e.g., silicon source materials and dopant source materials), are preferably selected to provide sufficient vapor pressure, sufficient thermal stability at substrate temperature, and sufficient reactivity of the compounds for effecting deposition by ALD. "Sufficient vapor pressure" typically supplies enough source chemical molecules in the gas phase to the substrate surface to enable self-saturated reactions at the surface at the desired rate. "Sufficient thermal stability" typically means that the source chemical itself does not form growth-disturbing condensable phases on the surface or leave harmful level of impurities on the substrate surface through thermal decomposition. In other words, temperatures are kept above the condensation limits and below the thermal decomposition limits of the selected reactant vapors. One aim is to avoid uncontrolled condensation of molecules on the substrate. "Sufficient reactivity" typically results in self-saturation in pulses short enough to allow for a commercially acceptable throughput time. Further selection criteria include the availability of the chemical at high purity and the ease of handling of the chemical.

In some embodiments the silicon precursor is an aminosilane or an aminesilane.

In some embodiments the silicon precursor comprises aminosilane, where the silicon is bonded to one nitrogen atom and three hydrogen atoms. For example, the silicon precursor may comprise dialkylaminesilane, $(R_2N)Si-H_3$.

In some embodiments the silicon precursor comprises a silicon amine, where silicon is bonded to two nitrogen atoms and two hydrogen atoms. For example, the silicon precursor may comprise bis(dialkylamine)silane, $(R_2N)_2Si-H_2$. In some embodiments the silicon precursor comprises BDEAS (=bis(diethylamino)silane).

In some embodiments the silicon precursor comprises a silicon amine, where silicon is bonded to three nitrogen atoms and one hydrogen atom. For example, the silicon precursor may comprise tris(dialkylamine)silane, $(R_2N)_3Si-H_1$.

In some embodiments, the silicon precursor comprises a silicon amine, where silicon is bonded to four nitrogen atoms. For example, the silicon precursor may comprise tetrakis (dialkylamine) silane, $(R_2N)_4Si$.

Organic compounds having a Si—Si bond and an $NH_x$ group either attached directly to silicon (to one or more silicon atoms) or to a carbon chain attached to silicon are used in some embodiments. In some embodiments, the silicon precursor may comprise an aminodisilane, such as hexakis(ethylamino)disilane. In some embodiments the silicon compound may have the formula:

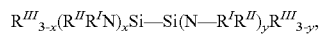

wherein the
x is selected from 1 to 3;
y is selected from 1 to 3;
$R^I$ is selected from the group consisting of hydrogen, alkyl, and substituted alkyl;
$R^{II}$ is selected from the group consisting of alkyl and substituted alkyl; and
$R^{III}$ is selected from the group consisting of hydrogen, hydroxide (—OH), amino (—$NH_2$), alkoxy, alkyl, and substituted alkyl;
and wherein the each x, y, $R^{III}$, $R^{II}$ and $R^I$ can be selected independently from each other.

In some embodiments the silicon compound is hexakis (monoalkylamino)disilane:

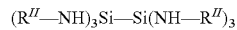

In other embodiments the silicon compound is $(CH_3-O)_3Si-Si(O-CH_3)_3$

In some embodiments the dopant precursor is a boron compound. Exemplary boron compounds include boron alkoxide compounds, such as $B(OR)_3$ and alkylboron compounds, such as $BR_3$. In some embodiments the dopant precursor is trimethylboron $(B(CH_3)_3)$ or triethylboron $(B(C_2H_5)_3)$.

In some embodiments the dopant precursor is a phosphorous compound. Exemplary phosphorous compounds include phosphorous alkoxides, such as $P(OR)_3$ and alkylphosphorous compounds, such as $PR_3$. In some embodiments the dopant precursor is trimethylphosphor: $P(CH_3)_3$. In some embodiments $PH_3$ can be used.

In some embodiments the dopant precursor is an arsenic compound. In other embodiments the dopant precursor is a carbon compound. Exemplary arsenic compounds include $AsH_3$ and alkylarsenic compounds, such as $As_2(CH_3)_4$. Exemplary carbon compounds include alcohols $C_xH_yOH$ and hydrocarbons $C_xH_y$.

As discussed above, in some embodiments oxygen plasma is used as the reactive oxygen source. Oxygen plasma may be generated in the reaction chamber, for example from $O_2$ that is flowed into the reaction chamber. In some embodiments oxygen plasma is generated in the vicinity of the substrate, for example above the substrate. In some embodiments oxygen plasma is generated outside of the vicinity of the substrate. For example, oxygen plasma may be generated remotely, outside of the reaction chamber. In some embodiments thermal ALD is used and reactive species of oxygen, for example ozone or nitrogen oxides $NO_x$, wherein x is from about 0.5 to about 3, which are not excited, are used.

SSD Layer Structures

Figure 9:
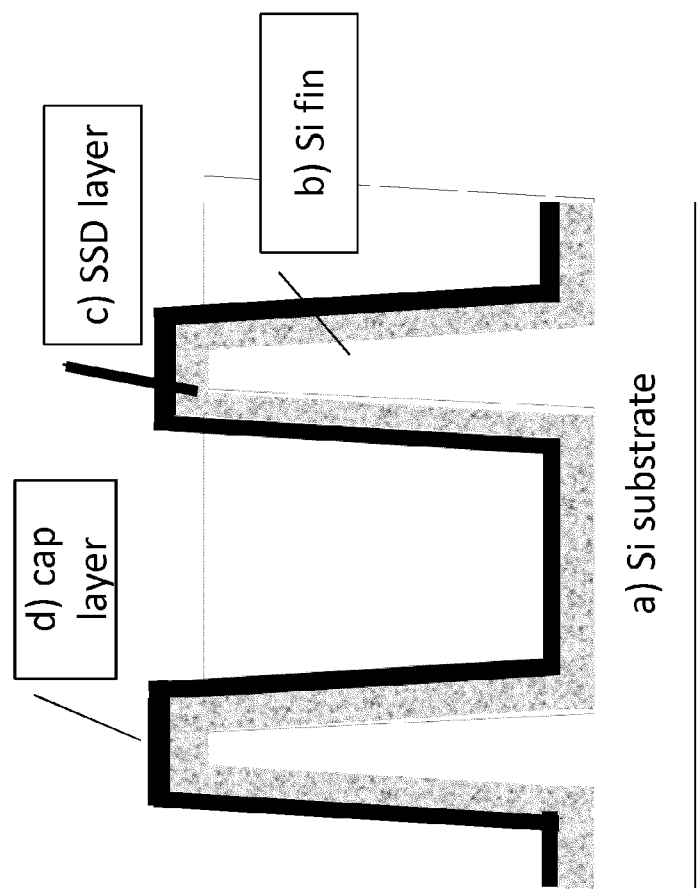
FIG. 9 illustrates a Si fin structure on which a SSD layer and a cap layer have been deposited.

In some embodiments the dopant films deposited by the methods disclosed herein can be used in solid state doping (SSD) layer stacks. FIG. 9 shows an example of an SSD layer stack for FinFet device manufacturing. The Si fin is typically fabricated from a Si wafer. The wafer with the Si fin structure is transferred to ALD process module, where a first ALD process is used for depositing the SSD layer. A second deposition process can then be used to deposit a cap layer, as illustrated in FIG. 9. In some embodiments the first and second processes are conducted without an air break; that is, in-situ sequential deposition of SSD layer and cap layer is carried out.

Figure 10:
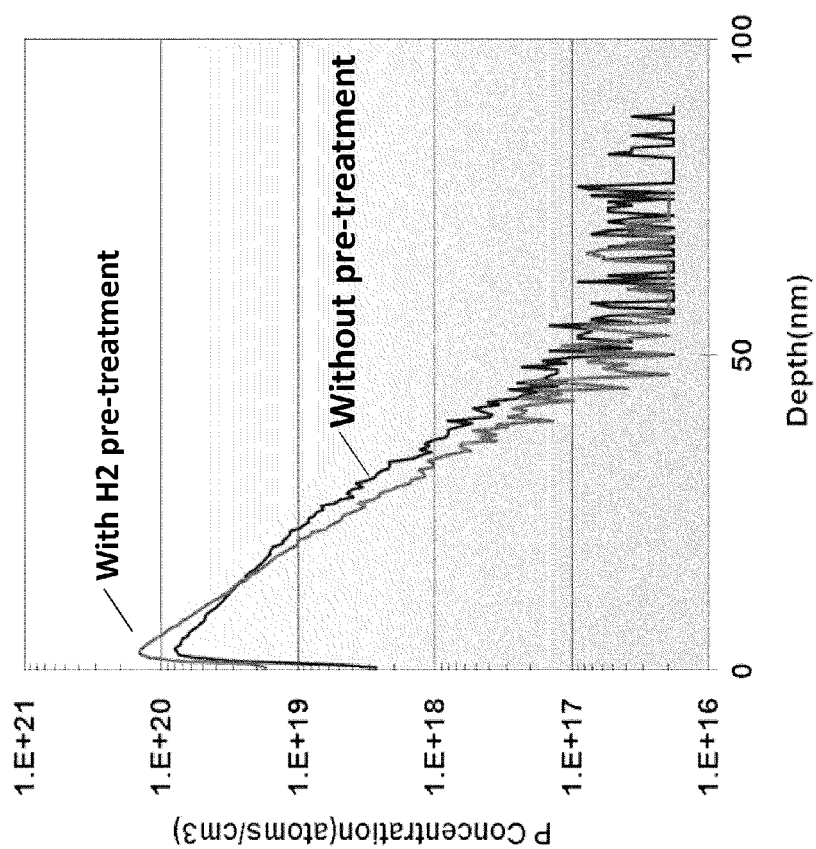
FIG. 10 illustrates the effect of $H_2$ plasma pre-treatment on P drive-in into Si as measured by SIMS.

In some embodiments an in-situ plasma pre-treatment of the substrate is conducted before SSD layer deposition to enhance doping efficiency into the Si fin. FIG. 10 shows the effect of $H_2$ plasma pre-treatment on P drive-in into Si as measured by SIMS. The original SSD layer was a 5 nm thick layer of PSG deposited by PEALD and having a P concentration of 7 wt % (2.8E+21 at/cm3). The cap layer was a 5 nm thick SiO layer deposited by PEALD. The rapid thermal anneal condition was 4 sec at 1000 deg-C. in a $N_2$ atmosphere. The PSG with $H_2$ plasma pre-treatment sample showed a higher P drive-in level and a shallow diffusion depth. The $H_2$ plasma pre-treatment can provide some tuning space for FinFet device design. The pre-treatment is not limited only $H_2$ plasma. In some embodiments the pre-treatment plasma may be selected from Ar, He, H2, Fluorine containing gas and their mixed gas plasma.

Figure 11A:
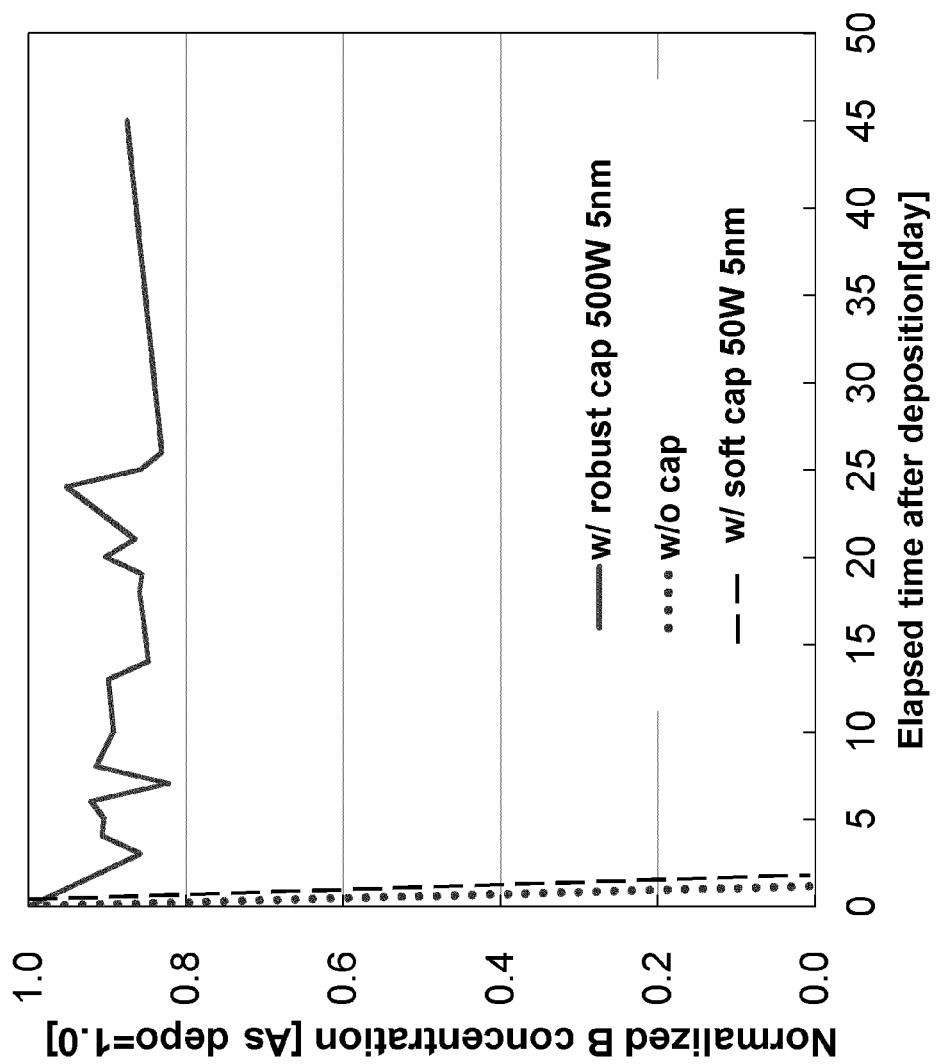
FIG. 11A illustrates the in-situ cap effect for B aging of a BSG SSD layer.
Figure 11B:
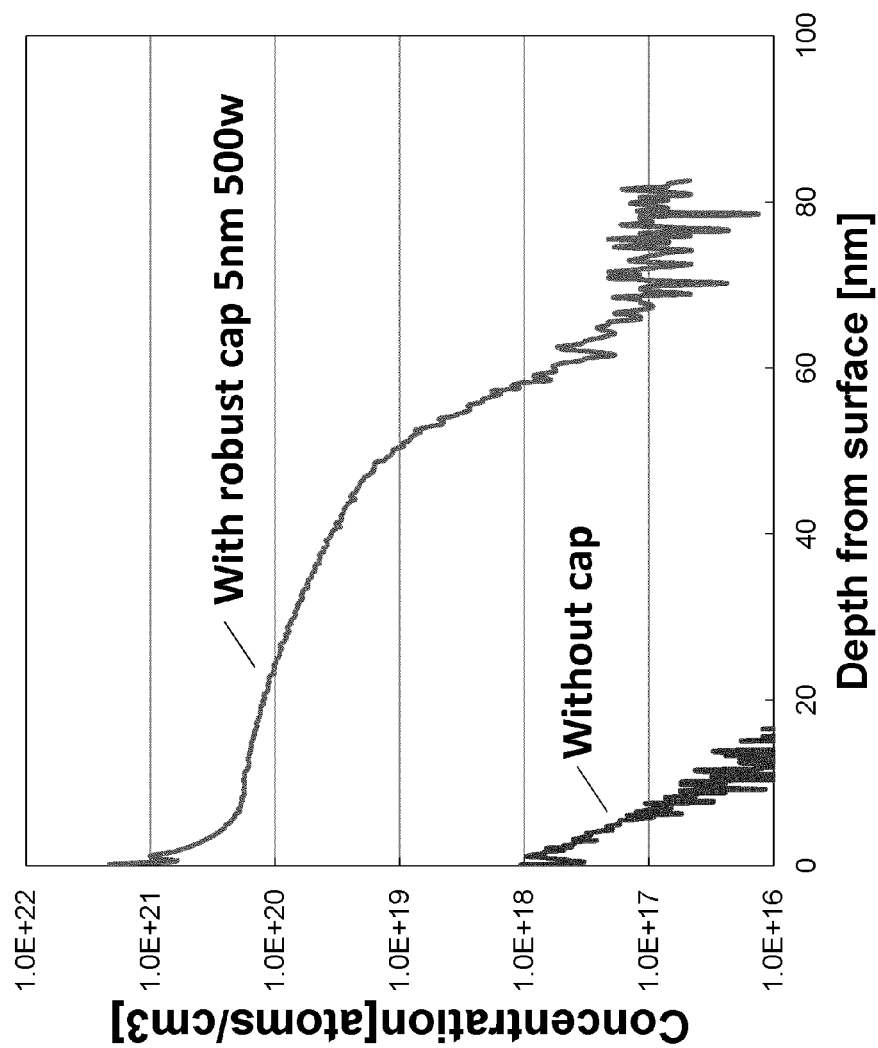
FIG. 11B illustrates the effect of the cap on dopant penetration.

As illustrated in FIG. 9 and discussed above, in some embodiments a cap layer is deposited over the dopant layer. In some embodiments the cap layer is directly over and contacting the dopant layer. The cap layer may comprise, for example, SiO or SiN. In some embodiments the cap layer comprises an oxide or nitride of a group 13, 14 or 15 element. FIG. 11A illustrates the in-situ cap effect for B aging of a BSG SSD layer. It is well known that B concentration in high dopant level BSG decrease over time with exposure to air. In FIG. 11A the vertical axis indicates relative B concentration in a BSG SSD layer as calculated from FTIR B—O peak area. For this test, a BSG SSD layer was deposited using CK=10 and had a B concentration of ~1.2E22 atoms/cm³. The B concentration is normalized by B—O peak area of an as-deposited BSG sample. The B concentration in BSG samples without cap and with a soft cap (here a PEALD SiO cap layer with a thickness of 5 nm deposited by using low power; 50 w) decreased immediately after deposition with exposure to air. On the other hand, BSG samples with a robust cap (here a PEALD SiO cap layer with a thickness of 5 nm deposited by using high power; 500 w) maintained >80% of the initial B concentration. FIG. 11B illustrates the effect of the cap on dopant depth.

The cap is not limited only to SiO films but can also be other films, such as SiN, SiON, P(B)N, P(B)ON, etc. . . . and their stack is considerable such as SSD film with PN (or BN) and SiN (or SiO) stack cap.

Figure 8:
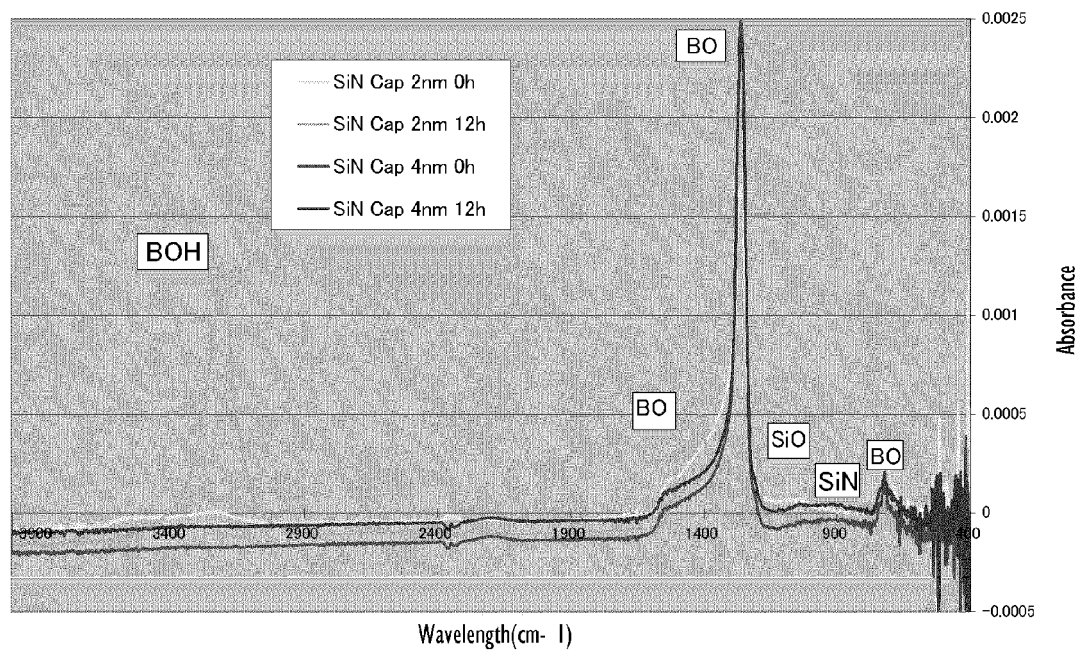
FIG. 8 is an FT-IR spectrum illustrating the cap effect of a 4 nm SiN cap over a $B_2O_3$ layer as a function of time. A good cap effect was observed.

One example of a cap layer of a material other than SiO is illustrated in FIG. 8. FIG. 8 is a FT-IR graph showing that 4 nm of SiN is enough to maintain the B—O peak of an under layer of BO even after a 12 h exposure to air. The film thickness is one important parameter to maintain B concentration in an SSD layer. In FIG. 8, a 4 nm film was sufficient to maintain B concentration but a 2 nm did not maintain B concentration as well. Thus, the film thickness for a cap layer may be selected, in part, in view of cap film quality. As illustrated in FIG. 11A, the film quality may affect the cap capability. Thinner film thickness, such as 1 nm, may be used with a good quality film to maintain the B concentration in SSD layer. In some embodiments the cap layer is from about 1 to about 10 nm, and may be about 4 nm or greater.

Figure 12A:
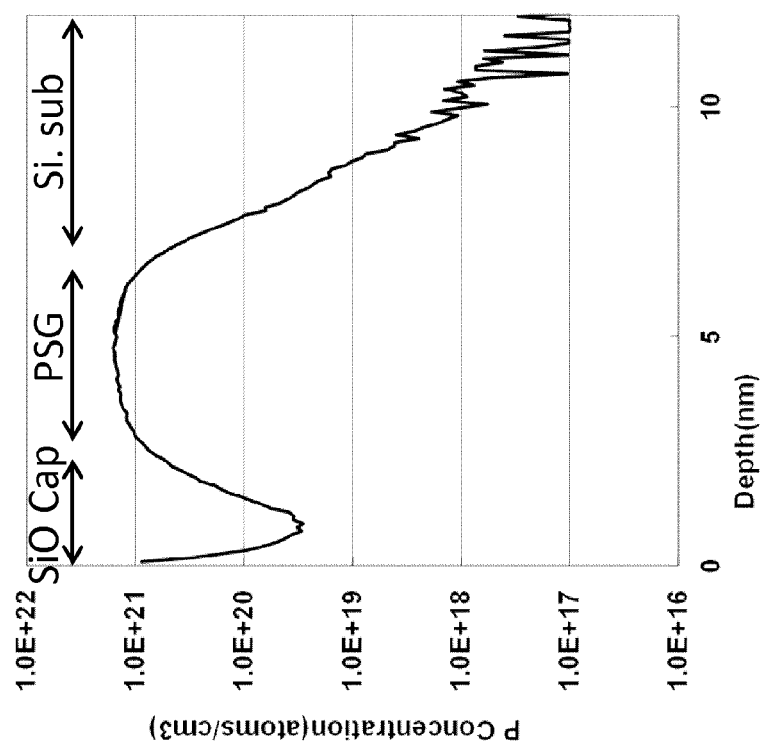
FIG. 12A illustrates a uniform P dopant concentration in an SSD film.
Figure 12B:
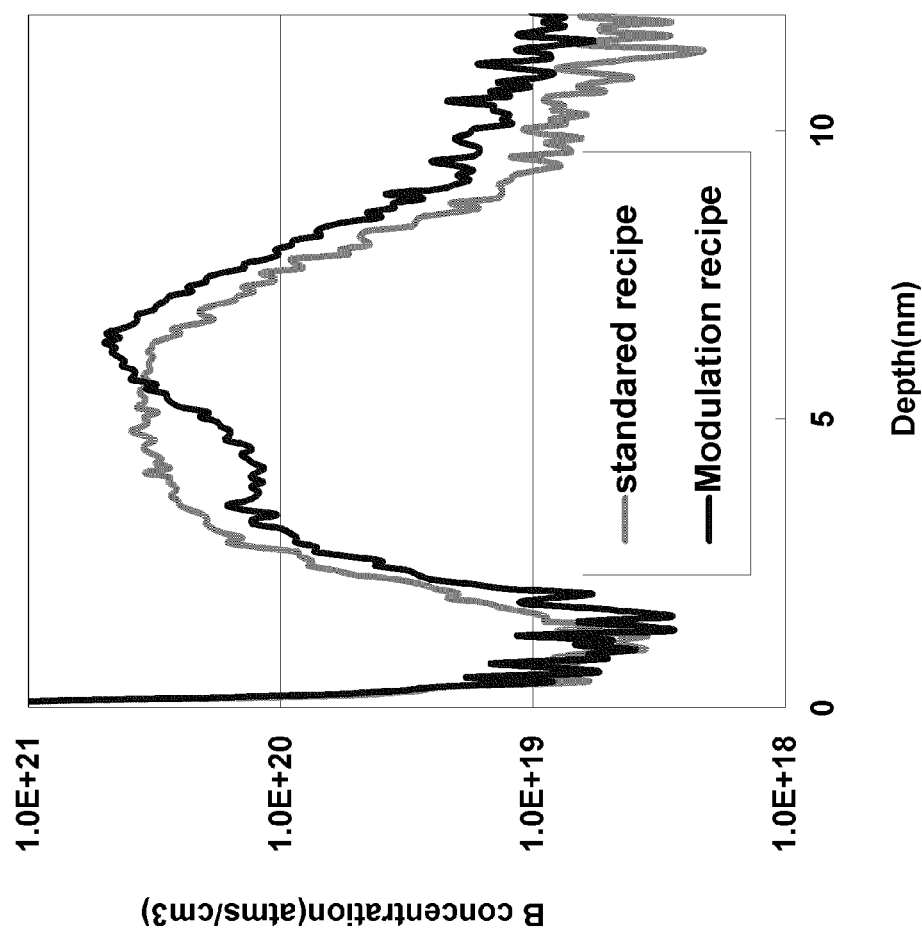
FIG. 12B compares B dopant concentration in films deposited with a standard recipe and a modulation recipe.

The depth profile of the dopant in the SSD layer can be selected based on FinFet device design. For example, uniform concentration in an SSD film is shown in FIG. 12A, a modulated concentration in an SSD film is shown FIG. 12B, and a monolayer (one pulse chemical adsorption) is shown FIG. 12C. The PSG layer with uniform depth profile shown in FIG. 12A was deposited by using the reaction conditions in Table 5, below. The modulated depth profile for the BSG film shown in FIG. 12B as the "modulation recipe" was deposited using the condition in Table 4, below, and the pulse interval in FIG. 18. The initial B concentration (near the interface between the Si substrate and SSD film) is higher than the B concentration at the SSD film surface (away from the Si substrate). This film is effective to realize high concentration and shallow diffusion into a Si substrate. This profile is easily tuned by adjusting the dopant precursor pulse ratio and interval taking into account device design requirements.

Figure 12C:
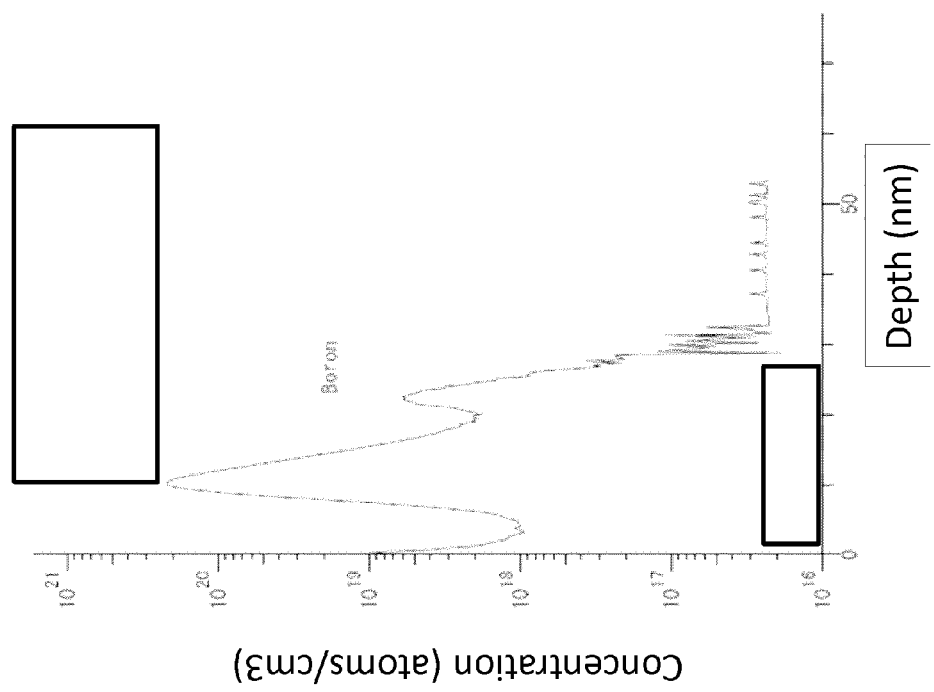
FIG. 12C illustrates B dopant concentration in a dopant film comprising a monolayer of dopant.

In some embodiments a single monolayer of dopant is deposited. One example of the depth profile for such a monolayer is shown in FIG. 12C. Here, the monolayer was deposited by using Condition 1 in Table 3, below. The single monolayer of dopant is effective to provide extremely shallow diffusion into a Si substrate when this is indicated by device design. The dopant precursor is flowed in to the process module after pre-treatment only one time to form a chemisorbed dopant monolayer on the Si surface. The SSD monolayer is capped, for example by PEALD SiO.

Buffer Layer Structure

In some embodiments, the dopant thin film, such as a doped silicon dioxide, can be used as a buffer layer during doping of a silicon substrate by annealing a dopant oxide layer. For example a doped silicon dioxide buffer layer may be used between a dopant layer, such as a dopant oxide layer and a cap layer, such as a SiN cap layer. The buffer layer may reduce or prevent dopant diffusion from the underlying dopant layer into structures overlying the buffer layer. Thus, dopant is directed into the underlying silicon substrate during annealing. This may be used, for example, to increase dopant density without having to modify the anneal conditions. In some embodiments the doped silicon oxide buffer layer structure is formed on a silicon substrate, for example on a FinFet device. Although illustrated primarily in terms of a doped silicon oxide buffer layer, other dopant layers may be used and deposited as described herein.

Figure 13:
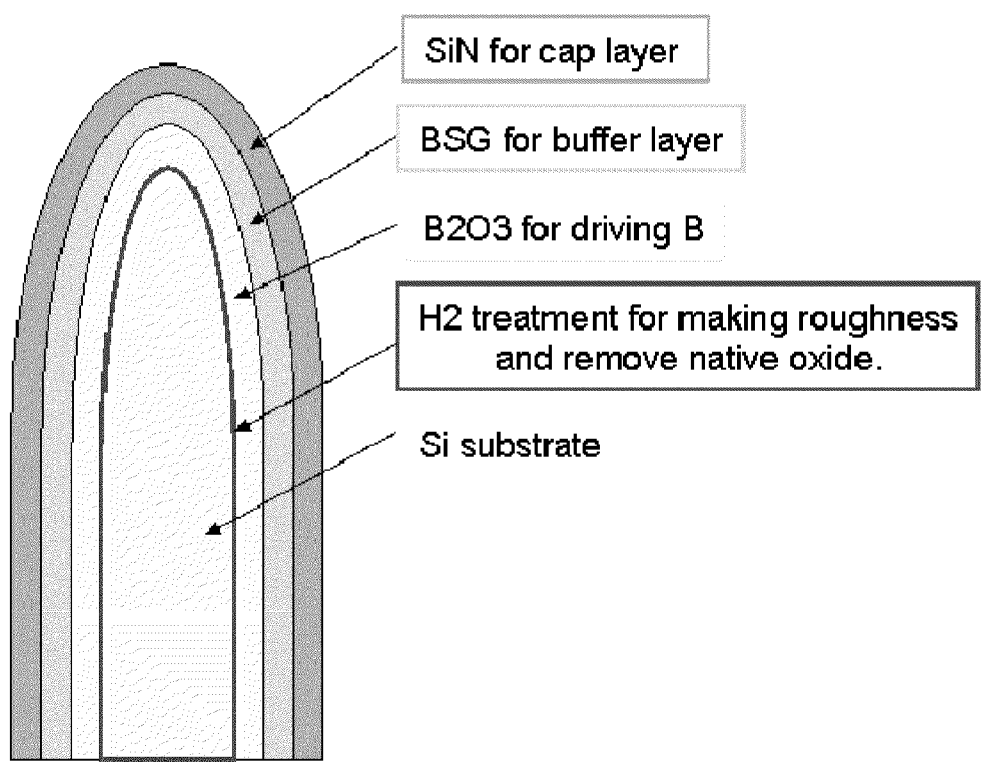
FIG. 13 illustrates a structure utilizing a BSG buffer layer.
Figure 14:
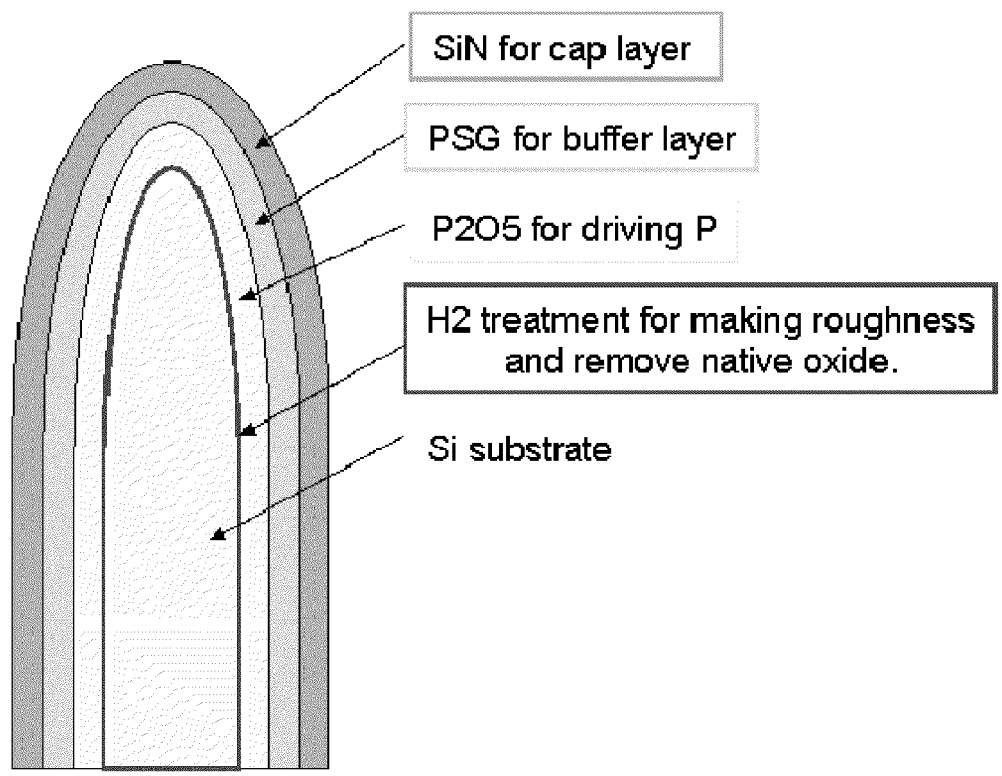
FIG. 14 illustrates a structure utilizing a PSG buffer layer.

An exemplary boron doped silicon oxide buffer layer structure is illustrated in FIG. 13. An exemplary phosphorus doped silicon oxide buffer layer structure is illustrated in FIG. 14. As discussed below, the structure comprises a $H_2$ plasma treated silicon substrate, an overlying dopant oxide layer, which serves as a source of dopant that is driven into the silicon layer during an anneal, a doped silicon oxide buffer layer to reduce or prevent diffusion of dopant into overlying structures, and a cap layer that can reduce or prevent moisture from interacting with the dopant oxide, which may be hygroscopic.

Figure 7:
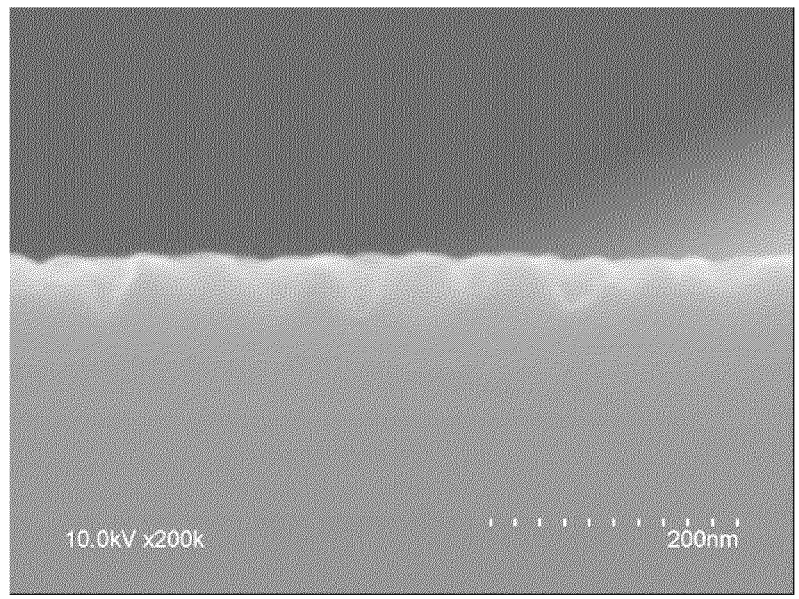
FIG. 7 is a photomicrograph of a silicon substrate following treatment with $H_2$ plasma.

In some embodiments, a structure such as those illustrated in FIGS. 13 and 14 is formed. First, a silicon substrate is treated with plasma, such as $H_2$ plasma. The plasma treatment may create surface roughness and removes the native oxide. This may facilitate dopant penetration into the silicon substrate. A silicon surface treated with $H_2$ plasma is shown in FIG. 7. As mentioned above, in some embodiments the plasma treatment and subsequent deposition processes may be carried out in situ.

Second, a dopant oxide layer is deposited directly over and contacting the treated substrate. In the examples illustrated in FIGS. 13 and 14, $B_2O_3$ and $P_2O_5$ layers are used, respectively. The dopant oxide layer comprises more dopant (such as P or B) than an overlying doped silicon dioxide layer. The dopant oxide layer may be deposited by ALD, for example using multiple dopant oxide deposition cycles as described herein. However, in other embodiments, other types of deposition may be used, such as thermal CVD. In some embodiments the dopant oxide layer is from about 1 to about 10 nm thick, or about 2 nm thick. In some embodiments the dopant oxide layer may be deposited in situ with the doped silicon oxide layer and/or the cap layer.

Third, a dopant layer such as a doped silicon dioxide buffer layer is deposited directly over and contacting the doped oxide layer. In the examples illustrated in FIGS. 13 and 14, BSG and PSG are deposited, respectively. Deposition of the doped silicon dioxide layer may be essentially as described elsewhere herein. In some embodiments the doped silicon oxide layer is about 1 to 10 nm thick, or about 3 nm thick.

A cap layer, such as a SiN cap layer is then deposited over the buffer layer. The cap layer may be directly over and contacting the buffer layer, as illustrated in FIGS. 13 and 14. The dopant oxide layers in the structure may have hygroscopic properties and the cap layer may reduce the interaction of any moisture with the underlying doped silicon dioxide buffer layer and/or the dopant oxide layer. As mentioned above, FIG. 8 is an FT-IR graph showing that 4 nm of SiN is enough to prevent an underlying $B_2O_3$ layer from reacting with moisture. In some embodiments the cap layer is from about 1 to about 10 nm, and may be about 4 nm or greater. In some embodiments a SiN cap layer of about 4 nm thick is used.

In some embodiments, for example as described above, a doped silicon dioxide layer serves as a dopant source. For example, in some embodiments a doped silicon dioxide layer alone is deposited over a silicon substrate and annealed to drive dopant into the silicon substrate. The doped silicon dioxide layer may be, for example, BSG or PSG.

In some embodiments a dopant oxide layer (such as $B_2O_3$ or $P_2O_5$) is deposited over a silicon substrate and a dopant silicon dioxide layer (such as BSG or PSG) is deposited over the dopant oxide and the structure annealed to drive boron into the underlying silicon substrate.

In some embodiments a further cap layer, such as a SiN cap layer, is deposited over the dopant silicon dioxide layer prior to annealing.

In some embodiments, the silicon substrate is treated with plasma, such as $H_2$ plasma, prior to depositing the dopant oxide layer and/or doped silicon dioxide layer. The plasma treatment can remove native oxide, if present, and/or increase surface roughness (as illustrated in FIG. 7), thus making it easier to drive dopant into the silicon substrate.

Figure 15:
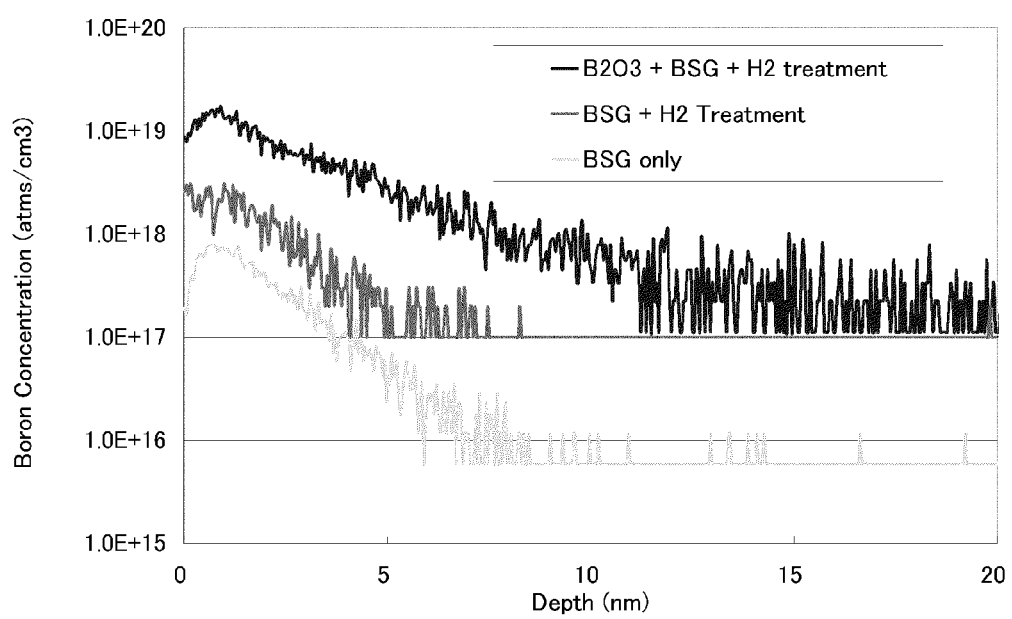
FIG. 15 illustrates the boron concentration at various depths in a silicon layer following annealing. The same anneal conditions were used for all experiments.

FIG. 15 illustrates the difference in dopant density (here, boron) following annealing of a BSG layer only over a silicon substrate, annealing of a BSG layer over a $H_2$ plasma surface-treated silicon substrate, and annealing of a structure as illustrated in FIG. 13 (a $B_2O_3$ layer deposited over $H_2$ plasma surface-treated silicon substrate and BSG buffer layer over the $B_2O_3$ layer).

The following non-limiting examples illustrate certain embodiments.

Example 1

Figure 4:
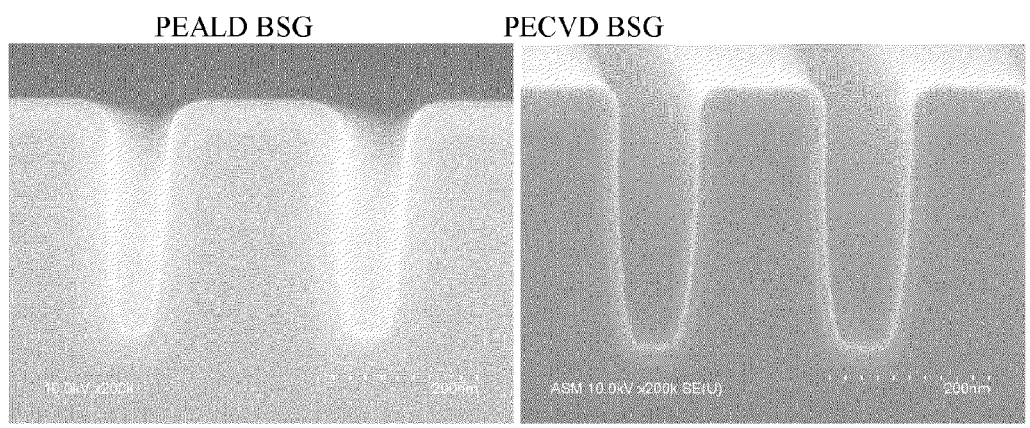
FIG. 4 is two photomicrographs showing BSG deposited by PEALD, as described herein (left) and as deposited by PECVD (right), on a three-dimensional substrate.
Figure 5:
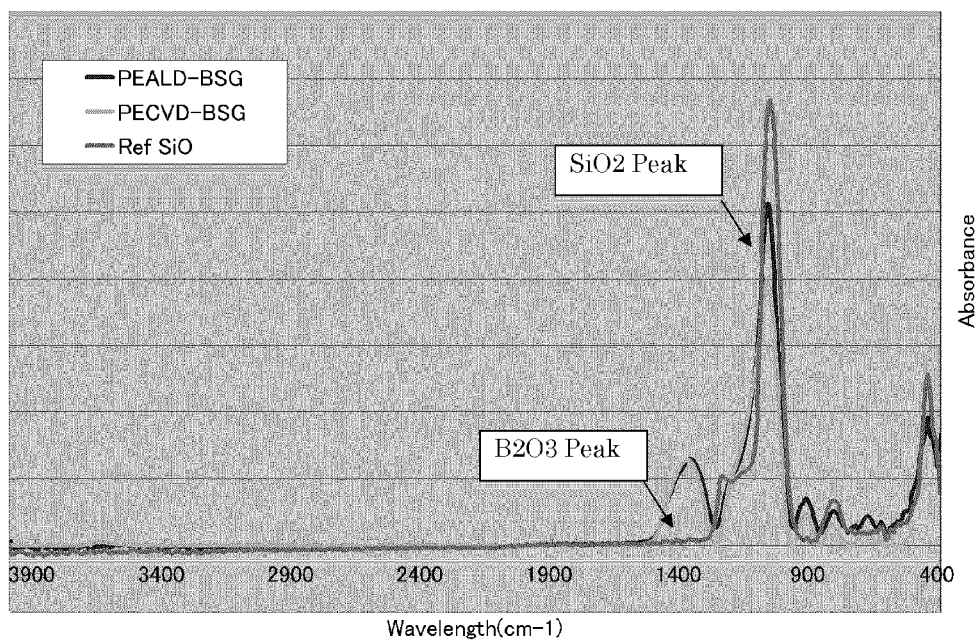
FIG. 5 is an FT-IR spectrum comparing the content of BSG films deposited by PEALD, as described herein, and by PECVD. The FT-IR spectra between PEALD and PECVD are almost the same.

BSG was deposited by PEALD and PECVD on a silicon wafer. The silicon source was BDEAS and the boron source was trimethyl borate or triethyl borate. As illustrated in FIG. 4 and in Table 1 below, PEALD BSG shows good step coverage. An FT-IR spectrum of PEALD and PECVD BSG is shown in FIG. 5.

Dopant density was measured by SIMS and dopant density uniformity was measured at 9 points on the wafer.

TABLE 1

| BSG deposited by PEALD | | | | |
|---|---|---|---|---|
| Si source | Boron source | Step coverage Side/Top | Step coverage Bottom/Top | Boron density uniformity (±%) |
| BDEAS | Trimethyl Borate | 100 | 100 | <10 |
| BDEAS | Triethyl Borate | 95 | 100 | <10 |

Example 2

Figure 6:
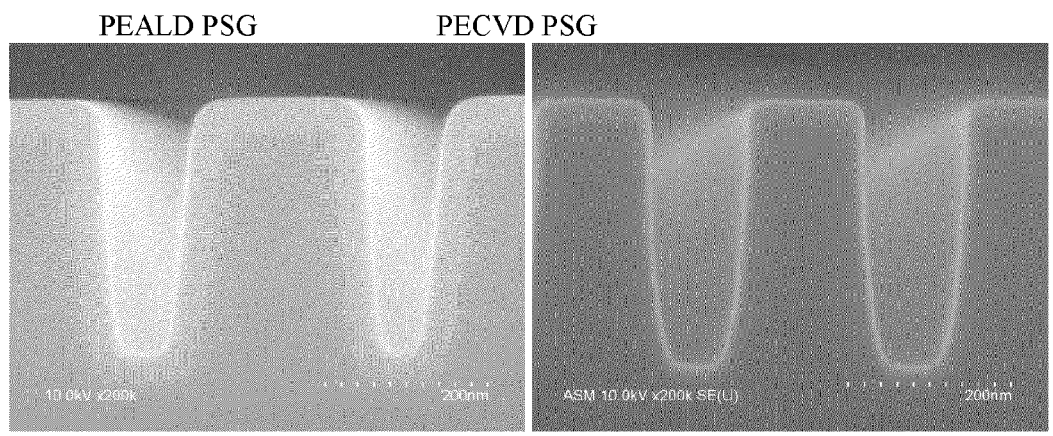
FIG. 6 is two photomicrographs showing PSG deposited by PEALD, as described herein (left) and as deposited by PECVD (right), on a three-dimensional substrate.

PSG was deposited by PEALD and PECVD on a silicon wafer. The silicon source was BDEAS and the phosphorus source was trimethylphosphite. As illustrated in FIG. 6, and shown in Table 2 below, PEALD PSG shows good step coverage.

Dopant density was measured by SIMS and dopant density uniformity was measured at 9 points on wafer.

TABLE 2

| PSG deposited by PEALD | | | | |
|---|---|---|---|---|
| Si source | Phosphorus source | Step coverage Side/Top | Step coverage Bottom/Top | Phosphorus density uniformity (±%) |
| BDEAS | Trimethylphosphite | 100 | 100 | <10 |

Example 3

Figure 16:
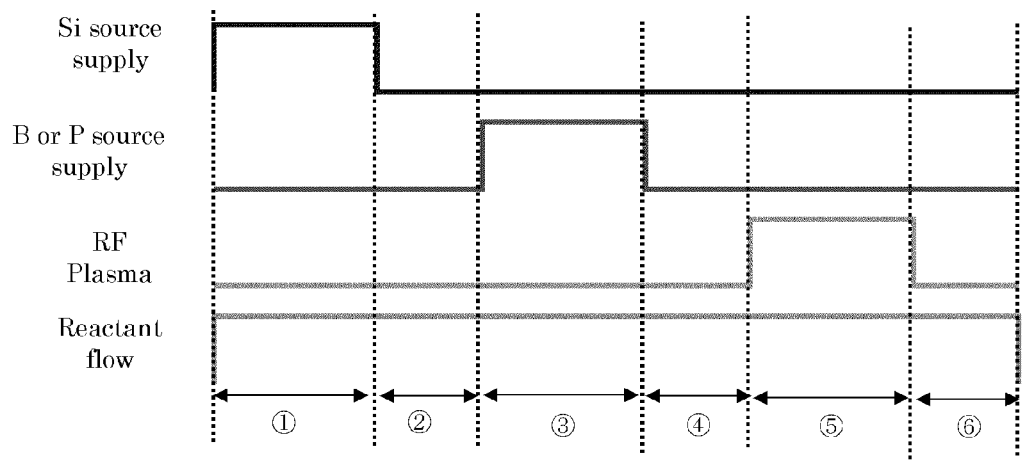
FIG. 16 illustrates a reactant pulse flow pattern for forming a BSG or PSG layer.

BSG or PSG is deposited by PEALD, using the pulsing sequence illustrated in FIG. 16. As illustrated, a reactant flow is maintained throughout the deposition process. The reactant may be, for example $O_2$. First, the silicon source gas, such as BDEAS, is supplied for about 0.5 s by FPS. The reaction chamber is purged for about 1 s, for example by continuing the flow of the reactant as illustrated. A dopant source gas, such as the illustrated B or P source, is provided, for example for about 0.5 s. The dopant source gas is purged for about 1 s, for example by continuing to flow the reactant as illustrated. RF plasma is provided, for example for about 1 s. The plasma may be generated in the flowing reactant, as illustrated, for example by applying power of about 50 W and about 300 Pa. The reaction chamber may then be purged again, such as by continuing to flow the reactant, without generating a plasma. The purge may be, for example, about 0.5 s. The cycle is repeated to deposit a boron or phosphorous doped silicon oxide film of a desired thickness.

Example 4

BSG was deposited by PEALD using various ratios of boron oxide deposition cycles to undoped silicon oxide deposition cycles. In some experiments the control knob ranged from 0.001 to infinite, silicon oxide cycles were from 10 to 1000 and films with a thickness of about 0.5 nm to about 30 nm were deposited.

Briefly, a silicon substrate was placed in a reaction chamber and oxygen was flowed through the reaction chamber continuously during the process. In each undoped silicon oxide deposition cycle, a silicon precursor, BDEAS, was pulsed into the reaction chamber for 0.3 s. Silicon precursor was purged for 0.8 s and RF power was applied for 0.4 s to generate oxygen reactive species, such oxygen excited species in flowing oxygen gas, followed by a further 0.1 s purge. In each boron oxide deposition cycle, a boron precursor, trimethyl borate, was pulsed into the reaction chamber for 0.4 s, followed by a 5 s purge. RF power was applied for 0.4 s, followed by a further 0.1 s purge.

Three exemplary deposition processes are described in Table 3 below in which the control knob ranged from 0.00167 (600 silicon oxide deposition cycles to 1 boron oxide deposition cycle) to infinite (no silicon oxide deposition cycles and 1000 boron cycles).

TABLE 3

| | SiO cycles | B doped cycles | Control Knob | Thickness | Total cycle |
|---|---|---|---|---|---|
| Conditon-1 | 600 | 1 | 0.00167 | 30 nm | 601 |
| Condition-2 | 10 | 10 | 1 | 0.5 nm | 20 |
| Condition-3 | 0 | 1000 | Infinite | 5 nm | 1000 |

Figure 17A:
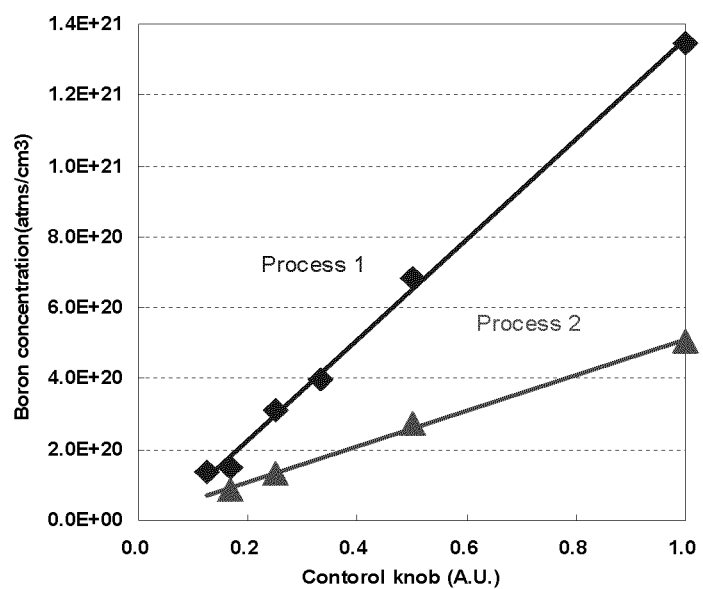
FIGS. 17A-C illustrate boron concentration as a function of the control knob (the ratio of boron precursor to silicon precursor).
Figure 17B:
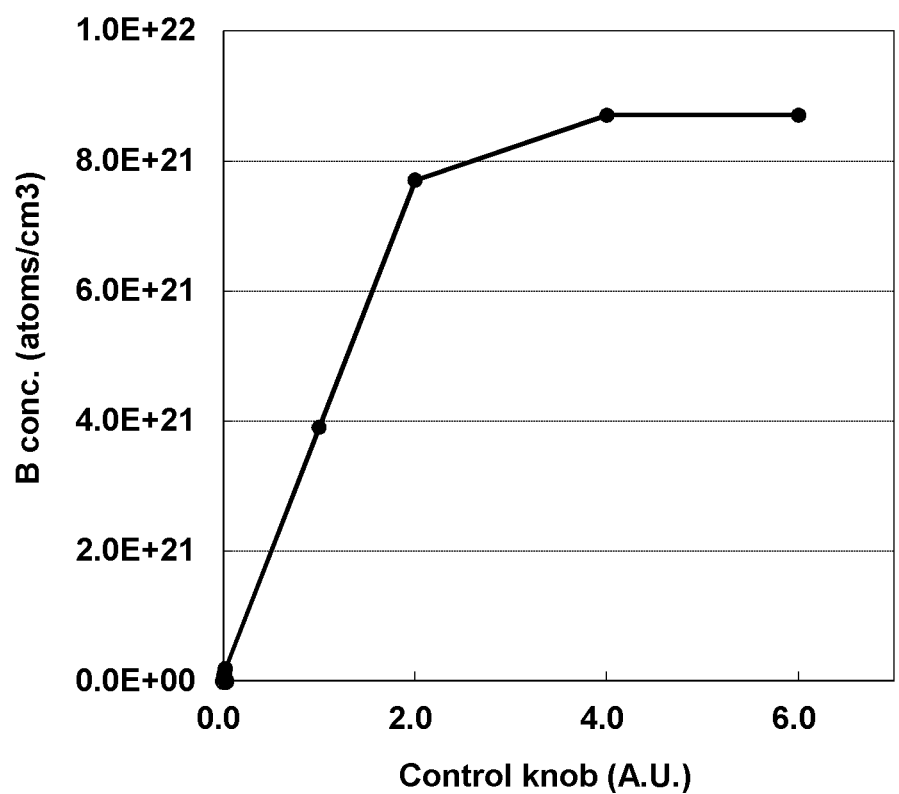
Figure 17C:
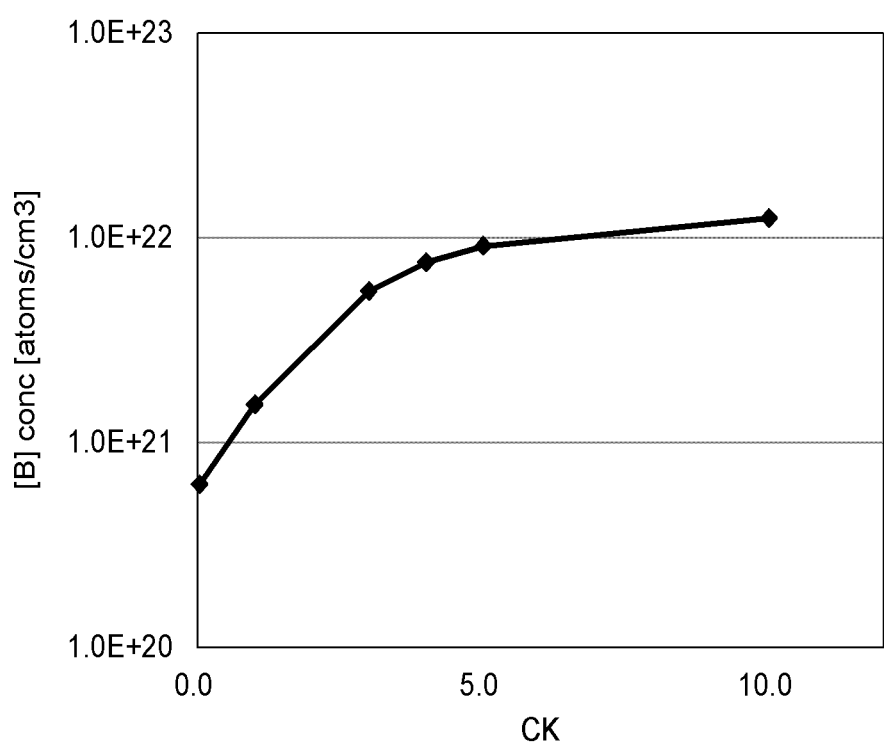

The concentration of boron at different control knob settings (ratios of boron oxide cycles to silicon oxide cycles) is illustrated in FIG. 17A-C. Process 1 and Process 2 (FIG. 17A) are described in Table 4. By varying the ratio of cycles, different concentrations of boron can be achieved in the BSG layer.

TABLE 4

Conditions for BSG deposition by Process 1 and 2

| | Process1 | Process2 |
|---|---|---|
| Susceptor Temp | 300 deg C. | 300 deg C. |
| Electrode Gap | 14.5 mm | 14.5 mm |
| Press | 200 Pa | 200 Pa |
| RF Power | 50 W | 500 W |
| Oxidant gas | 500 sccm | 500 sccm |
| Si Precursor carrier gas | 2000 sccm | 2000 sccm |
| Dopant Precursor carrier gas | 2000 sccm | 2000 sccm |
| Si Precursor Feed | 0.3 | 0.3 |
| Si Precursor Purge | 0.8 | 0.8 |
| RF ON | 0.4 | 0.4 |
| Post Purge | 0.1 | 0.1 |
| B Precursor Feed | 0.4 | 0.4 |
| B Precursor Purge | 5.0 | 5.0 |
| RF ON | 0.4 | 0.4 |
| Post Purge | 0.1 | 0.1 |

Figure 18:
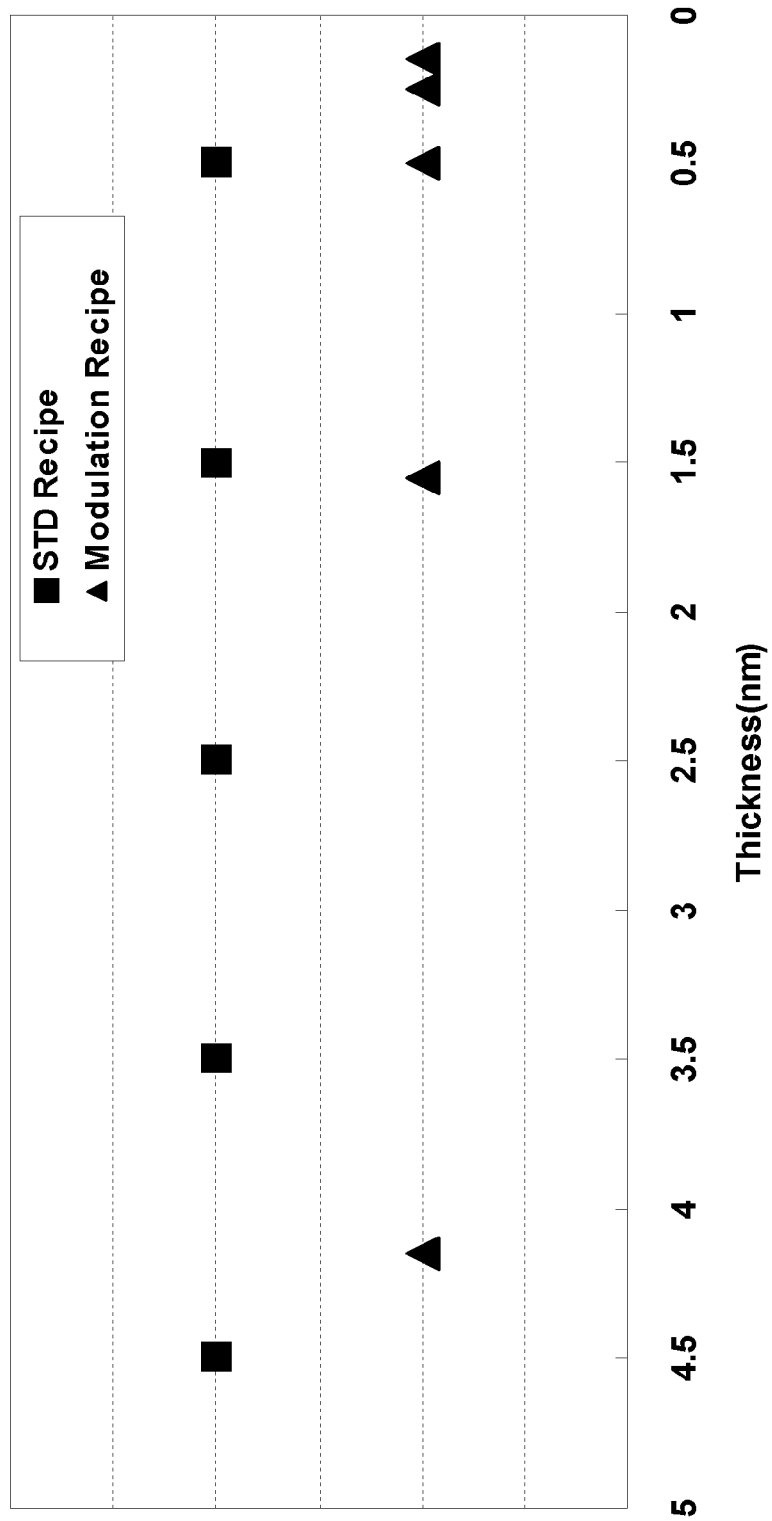
FIG. 18 shows the provision of boron oxide deposition cycles relative to total thickness in doped silicon oxide deposition processes.

In some experiments, the boron oxide deposition cycle was provided at intervals during the deposition process, as shown in FIG. 18, where the squares and triangles indicate dopant cycle provision. In the STD Recipe experiments (FIG. 18, squares), dopant cycles were provided at regular intervals. In particular, the undoped silicon oxide cycle was repeated until 0.5 nm of silicon oxide was deposited. A single boron oxide cycle was then carried out. Subsequently, a single boron oxide deposition cycle was provided after every additional 1.0 nm of silicon oxide until a 5 nm film had been deposited. Deposition cycles were essentially as described above.

In other experiments, additional boron oxide cycles were provided earlier in the deposition process, as shown for the Modulation Recipe in FIG. 18 (triangles). As can be seen in FIG. 18, three boron oxide deposition cycles were provided during the deposition of the first 0.5 nm of silicon oxide. Additional boron oxide deposition cycles were provided when the film reached 1.5 nm and 4 nm. Again, deposition cycles were essentially as described above.

FIGS. 19A and B show the dopant concentration as a function of depth for films with a uniform depth profile (FIG. 19A) and films deposited by the STD recipe and the Modulation recipe described above (FIG. 15B).

Example 5

PSG was deposited by PEALD using various ratios of phosphorous oxide deposition cycles to undoped silicon oxide deposition cycles were carried out. The process conditions are described in Table 5 below. Briefly, a silicon substrate was placed in a reaction chamber and oxygen was flowed through the reaction chamber continuously during the process. In each undoped silicon oxide deposition cycle, a silicon precursor, BDEAS, was pulsed into the reaction chamber for 0.3 s. Silicon precursor was purged for 0.8 s and RF power was applied for 0.4 s to generate oxygen reactive species in the flowing oxygen gas, followed by a further 0.1 s purge. In each phosphorous oxide deposition cycle, a phosphorous precursor, trimethylphosphite, was pulsed into the reaction chamber for 0.4 s, followed by a 5 s purge. RF power was applied for 0.4 s, followed by a further 0.1 s purge. A total of 90 deposition cycles was used for most experiments, producing films about 5 nm thick.

Figure 20A:
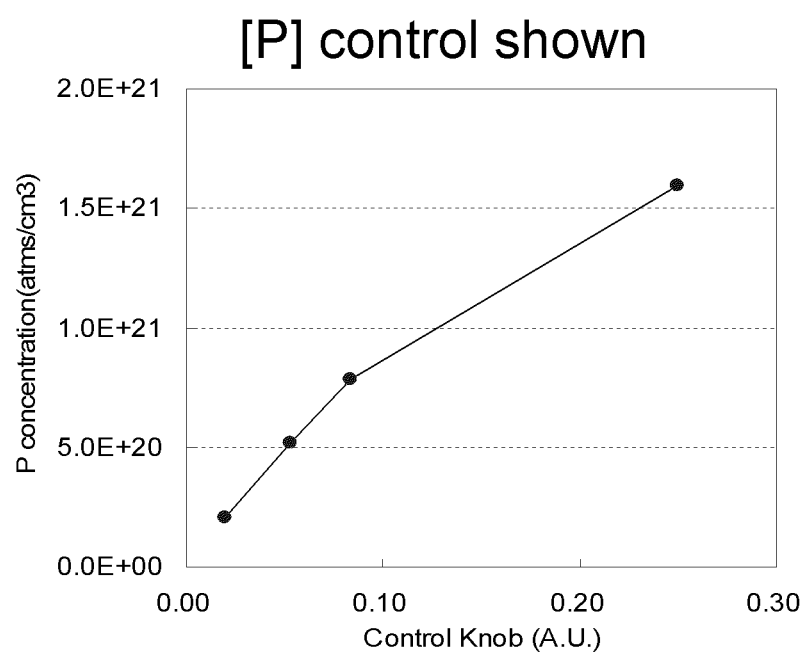
FIGS. 20A-C illustrate phosphorus concentration as a function of the control knob (ratio of phosphorus precursor to silicon precursor).
Figure 20B:
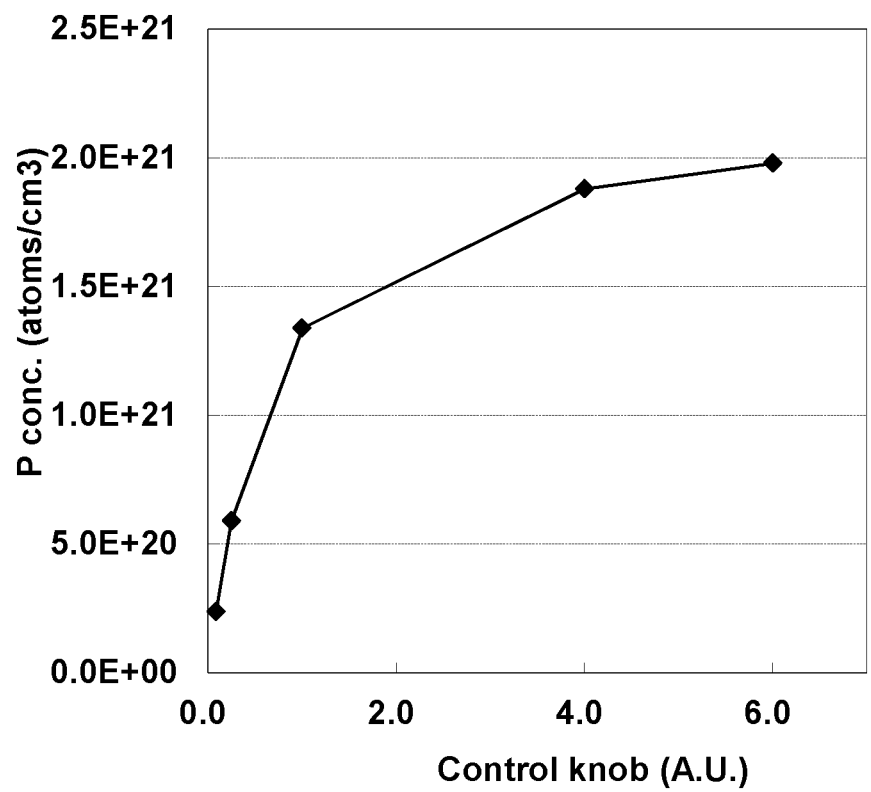
Figure 20C:
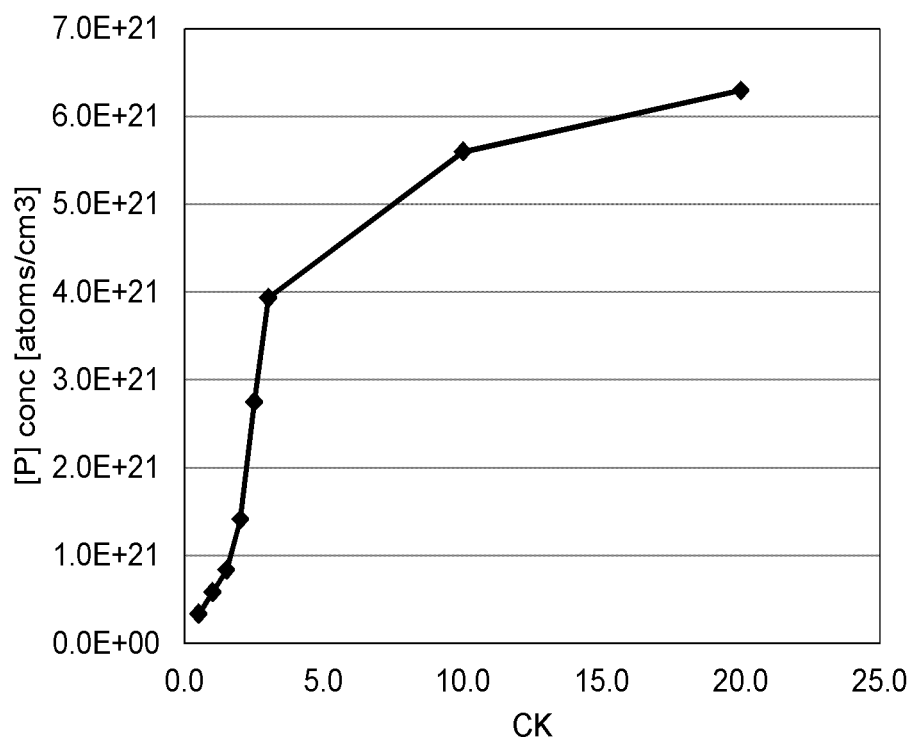

The concentration of phosphorous at different control knob settings (ratios of phosphorous oxide cycles to silicon oxide cycles) is illustrated in FIGS. 20A-C. By varying the ratio of cycles, different concentrations of phosphorous can be achieved in the PSG layer.

TABLE 5

PSG deposition conditions

| | CK1 |
|---|---|
| Susceptor Temp | 300 deg C. |
| Electrode Gap | 14.5 mm |
| Press | 200 Pa |
| RF Power | 50 W |
| Oxidant gas | 500 sccm |
| Si Precursor carrier gas | 2000 sccm |
| Dopant Precursor carrier gas | 2000 sccm |
| Si Precursor Feed | 0.3 |
| Si Precursor Purge | 0.8 |
| RF ON | 0.4 |
| Post Purge | 0.1 |
| P Precursor Feed | 0.3 |
| P Precursor Purge | 2.0 |
| RF ON | 0.4 |
| Post Purge | 0.1 |

A PSG film formed using a ratio of one phosphorus oxide versus one undoped silicon oxide cycles (a control knob of 1.00) was analyzed further. FIG. 19A shows the phosphorous concentration as a function of depth in the thin film.

Example 6

PSG was deposited on a silicon substrate by PEALD using the conditions in Example 5. Following deposition, and without annealing the film, a HF-dip was used to remove the PSG layer (FIG. 21D). Phosphorus concentration was measured as a function of depth (FIG. 21E). FIG. 21E shows that phosphorus does not significantly penetrate into the underlying silicon substrate during deposition of the PSG layer.

Example 7

PSG was deposited on a silicon substrate by PEALD using the conditions in Table 6 below.

TABLE 6

PSG deposition conditions

|  | PSG CK1 |
| --- | --- |
| Susceptor Temp | 300 deg C. |
| Electrode Gap | 14.5 mm |
| Press | 200 Pa |
| RF Power | 50 W |
| Oxidant gas | 500 sccm |
| Si Precursor carrier gas | 2000 sccm |
| Dopant Precursor carrier gas | 2000 sccm |
| Si Precursor Feed | 0.3 |
| Si Precursor Purge | 0.8 |
| RF ON | 0.4 |
| Post Purge | 0.1 |
| P Precursor Feed | 0.3 |
| P Precursor Purge | 2.0 |
| RF ON | 0.4 |
| Post Purge | 0.1 |

A lamp based rapid thermal anneal for 3 s at 1000° C. was used to drive boron into the substrate (FIG. 21A). Annealing conditions are provided in Table 7 below. Following anneal, the doped silicon oxide layer was removed by HF-dip (FIG. 21A) and the phosphorous concentration at various depths in the substrate was measured (FIG. 21C). FIG. 21C illustrates the penetration of phosphorus into the substrate following the anneal.

TABLE 7

Anneal conditions

| Tool | Mattson3000 |
| --- | --- |
| Anneal Temp. | 1000 deg C. |
| Gas | N2 |
| Anneal Time | 3 sec |
| Press | 1 atm |
| Transfer temp | 600 deg C. |

Figure 21F:
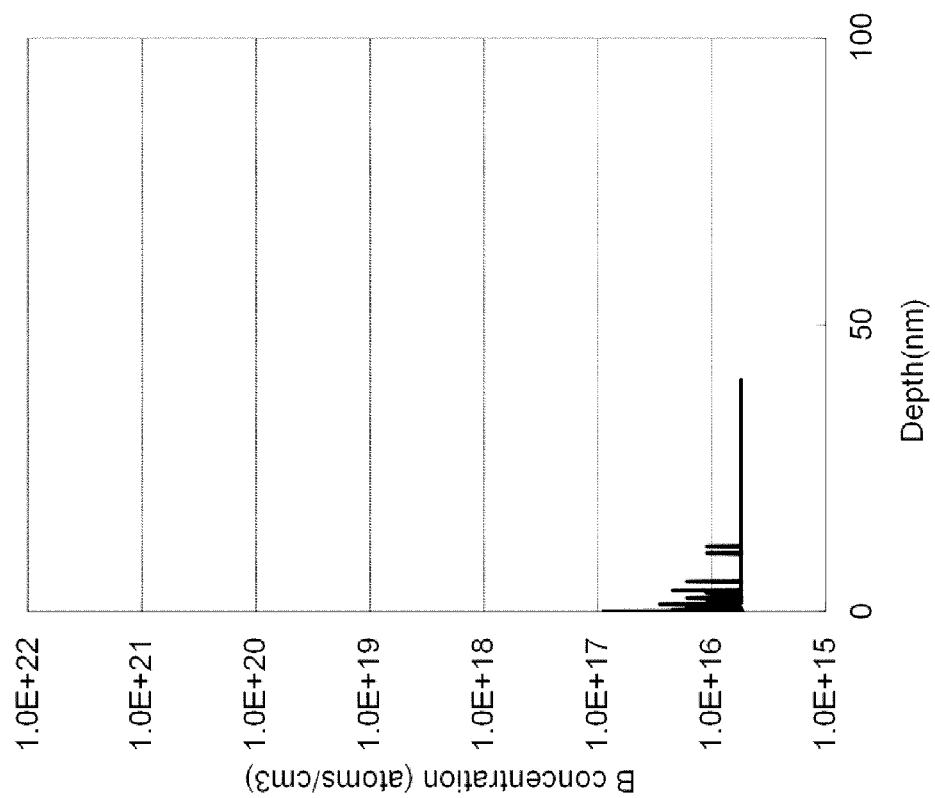

BSG films were also deposited and annealed. BSG films were deposited using the conditions in Table 8, below, and subsequently annealed using the conditions in Table 7. However, the substrate was treated with $H_2$ plasma prior to BSG deposition. $H_2$ plasma treatment conditions are provided in Table 9. FIG. 21F illustrates the measured boron concentration as a function of depth in the deposited film, and shows that boron does not significantly penetrate into the underlying silicon substrate during deposition of the BSG layer.

TABLE 8

BSG deposition conditions

|  | BSG CK2 |
| --- | --- |
| Susceptor Temp | 300 deg C. |
| Electrode Gap | 14.5 mm |
| Press | 200 Pa |
| RF Power | 50 W |
| Oxidant gas | 500 sccm |
| Si Precursor carrier gas | 2000 sccm |
| Dopant Precursor carrier gas | 2000 sccm |
| Si Precursor Feed | 0.3 |
| Si Precursor Purge | 0.8 |
| RF ON | 0.4 |
| Post Purge | 0.1 |

TABLE 8-continued

BSG deposition conditions

|  | BSG CK2 |
| --- | --- |
| B Precursor Feed | 0.3 |
| B Precursor Purge | 5.0 |
| RF ON | 0.4 |
| Post Purge | 0.1 |

TABLE 9

Pre-treatment Conditions

| Susceptor Temp | 300 deg C. |
| --- | --- |
| Electrode Gap | 14.5 mm |
| Press | 350 Pa |
| RF Power | 400 W |
| H2 | 1000 sccm |
| Ar | 1000 sccm |
| Trt Time | 30 sec. |

Following annealing and HF-dip, boron concentration was measured as a function of depth. The results are illustrated in FIG. 21B, which shows the penetration of boron into the substrate following the anneal.

Example 8

Figure 22:
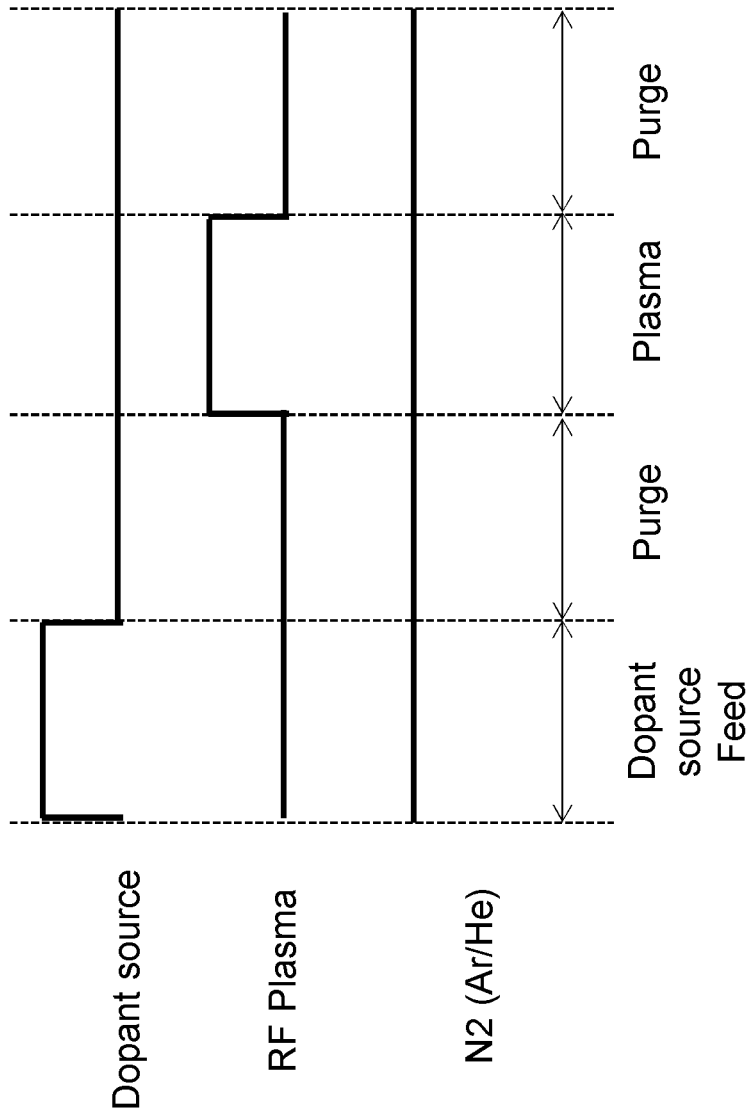
FIG. 22 illustrates a deposition sequence for depositing a PN layer.
Figure 23:
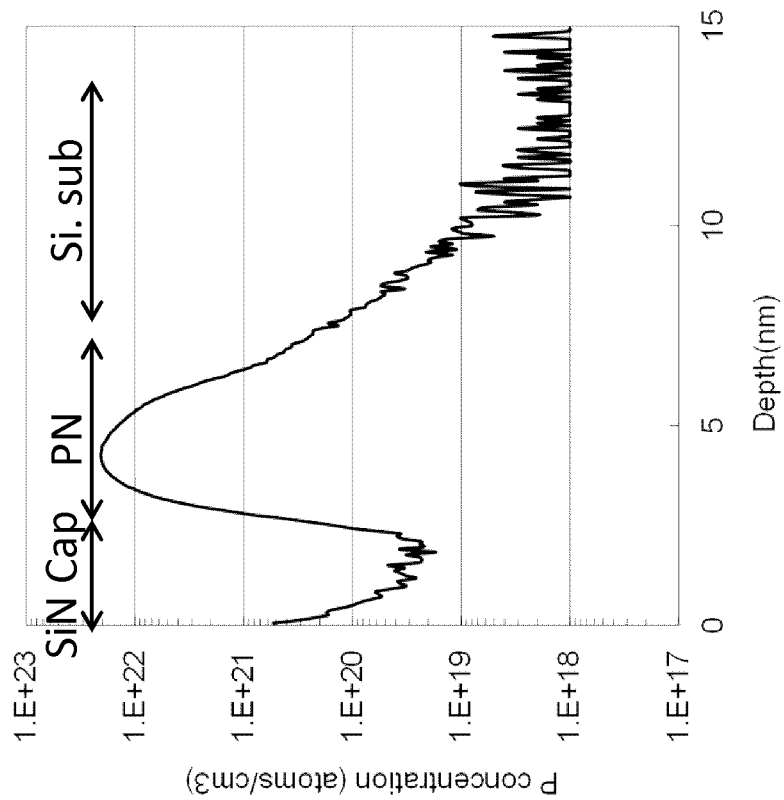
FIG. 23 shows the P concentration in a SSD layer structure comprising a PN layer.
Figure 24:
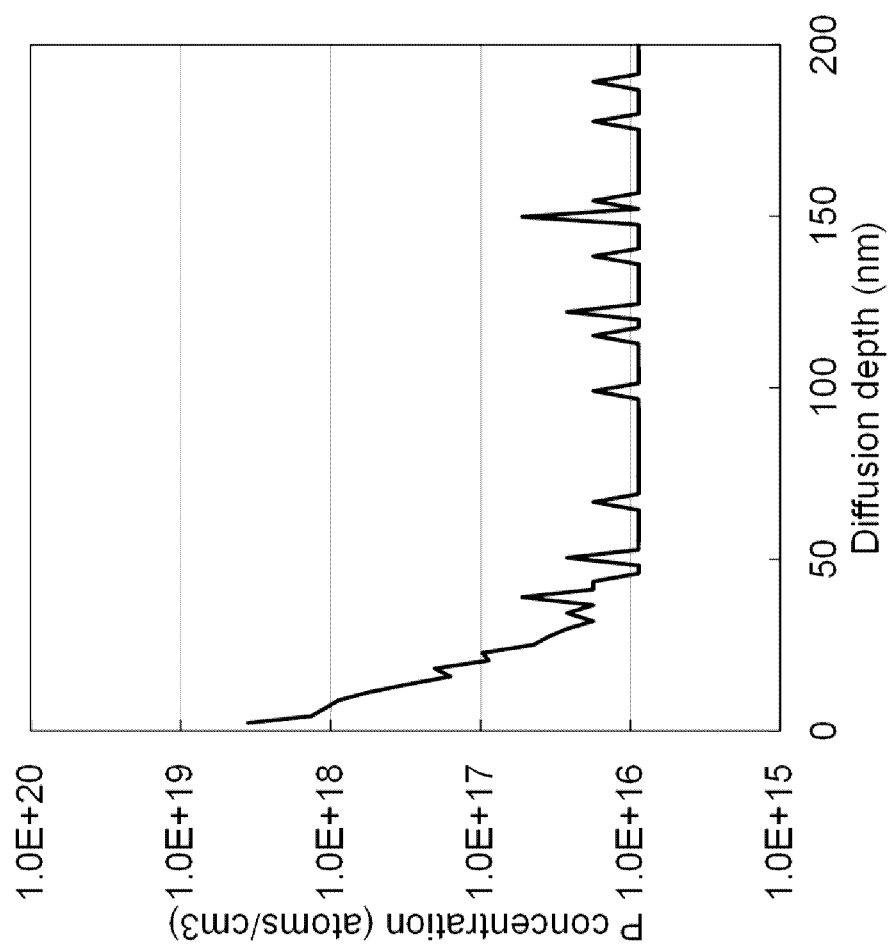
FIG. 24 illustrates P concentration in a silicon substrate following annealing of a PN layer.

PN was deposited on a silicon substrate by PEALD using TMPI as the P precursor and N plasma as the reactive species. The deposition conditions are provided in Table 10, below. Nitrogen flowed constantly and RF power was provided intermittently to create a plasma, as shown in FIG. 22. A growth rate of 0.015 nm/cycle was observed and the PN film had a uniformity of about 5% and a refractive index of about 1.66. In some experiments a SiN cap layer was deposited on the PEALD PN layer. FIG. 23 shows the P concentration relative to depth in the deposited film stack, as measured by SIMS. FIG. 24 shows P concentration in the Si substrate after annealing, as measured by SIMS.

TABLE 10

| Susceptor Temp | 200 deg C. |
| --- | --- |
| Electrode Gap | 7.5 mm |
| Press | 400 Pa |
| RF Power | 800 W |
| N2 flow | 2000 sccm |
| TMPI carrier Ar flow | 2000 sccm |
| P precursor feed | 0.3 sec |
| P Precursor Purge | 1.0 sec |
| RF ON | 0.2 sec |
| Post Purge | 0.1 sec |

We claim:

1. A method for depositing doped silicon oxide on a substrate by an atomic layer deposition (ALD) process, the ALD process comprising at least one doped silicon oxide deposition cycle, wherein a doped silicon oxide deposition cycle comprises:
   contacting the substrate with a silicon precursor;
   contacting the substrate with a dopant precursor; and
   contacting the substrate with a reactive species such that a doped silicon oxide is formed.

2. The method of claim 1, wherein the substrate is contacted simultaneously with the silicon precursor and the dopant precursor.

3. The method of claim 1, wherein the ALD process is a plasma enhanced atomic layer deposition (PEALD) process.

4. The method of claim 3, wherein the reactive species comprises oxygen.

5. The method of claim 1, wherein the reactive species comprises a non-excited species of oxygen.

6. The method of claim 1, wherein the reactive species comprises excited species of nitrogen.

7. The method of claim 1, wherein the substrate is contacted with oxygen after being contacted with the silicon precursor and the dopant precursor.

8. The method of claim 1, wherein the doped silicon oxide deposition cycle comprises, in order:
contacting the substrate with the silicon precursor;
contacting the substrate with the dopant precursor; and
contacting the substrate with a plasma generated from oxygen such that that a doped silicon oxide is formed.

9. The method of claim 1, wherein the doped silicon oxide deposition cycle comprises, in order:
contacting the substrate with the dopant precursor;
contacting the substrate with the reactive species such that a film comprising dopant is formed;
contacting the substrate with the silicon precursor; and
contacting the substrate with oxygen plasma such that a doped silicon oxide film is formed.

10. The method of claim 1, wherein the substrate is contacted with the dopant precursor prior to being contacted with the silicon precursor in the doped silicon oxide deposition cycle.

11. The method of claim 1, wherein the silicon precursor comprises a Si—N bond.

12. The method of claim 1, wherein the dopant precursor is a boron compound or a phosphorus compound.

13. The method of claim 1, wherein the doped silicon oxide is deposited over a three dimensional structure and has a step coverage of at least about 80%.

14. The method of claim 1, wherein the ALD process additionally comprises at least one silicon oxide deposition cycle, the silicon oxide deposition cycle comprising:
contacting the substrate with a silicon precursor; and
contacting the substrate with a reactive species comprising oxygen.

15. A method of doping a silicon substrate comprising:
treating the substrate surface with a plasma;
depositing a solid state diffusion (SSD) layer comprising a dopant over the Si substrate surface by an atomic layer deposition process comprising:
contacting the substrate with a silicon precursor;
contacting the substrate with a dopant precursor; and
subsequently contacting the substrate with a reactive species;
depositing a cap layer over the SSD layer;
and annealing the substrate to drive dopant from the SSD layer into the underlying silicon substrate.

16. The method of claim 15, wherein the dopant is selected from phosphorus, arsenic, antimony, boron, gallium and indium.

17. The method of claim 15, wherein the cap layer is selected from silicon oxide, silicon nitride, oxides of group 13, 14 or 15 elements and nitrides of group 13, 14 or 15 elements.

* * * * *

UNITED STATES PATENT AND TRADEMARK OFFICE
CERTIFICATE OF CORRECTION

| | | |
|---|---|---|
| PATENT NO. | : 9,153,441 B2 | Page 1 of 1 |
| APPLICATION NO. | : 14/184116 | |
| DATED | : October 6, 2015 | |
| INVENTOR(S) | : Takamure et al. | |

It is certified that error appears in the above-identified patent and that said Letters Patent is hereby corrected as shown below:

In the Drawings

Sheet 14 of 32 (FIG. 12B), Change "atms" to --atoms--.

Sheet 14 of 32 (FIG. 12B), Change "standared" to --standard--.

Sheet 18 of 32 (y-axis, FIG. 15), Change "atms" to --atoms--.

Sheet 20 of 32 (y-axis, FIG. 17A), Change "atms" to --atoms--.

Sheet 20 of 32 (y-axis, FIG. 17A), Change "Contorol" to --Control--.

Sheet 24 of 32 (y-axis, FIG. 19A), Change "atms" to --atoms--.

Sheet 24 of 32 (y-axis, FIG. 19B), Change "atms" to --atoms--.

Sheet 25 of 32 (y-axis, FIG. 20A), Change "atms" to --atoms--.

In the Specification

In column 6 at line 48, Change "Although" to --although--.

In column 15 at line 11, Change "-In" to --In--.

In column 16 at line 14, Change "(dialkylamine) silane," to --(dialkylamine)silane,--.

In column 16 at line 38, After "$R^{II})_3$" insert --.--.

In column 16 at line 41, After "$CH_3)_3$" insert --.--.

In column 21 at line 23 (approx.), Change "Conditon-1" to --Condition-1--.

In the Claims

In column 25 at line 17 (approx.), In Claim 8, after "such" delete "that".

Signed and Sealed this
Seventh Day of June, 2016

Michelle K. Lee
*Director of the United States Patent and Trademark Office*